United States Patent [19]
Kochi

[11] Patent Number: 5,951,632
[45] Date of Patent: Sep. 14, 1999

[54] PARALLEL SIGNAL PROCESSING CIRCUIT, SEMICONDUCTOR DEVICE HAVING THE CIRCUIT, AND SIGNAL PROCESSING SYSTEM HAVING THE CIRCUIT

[75] Inventor: Tetsunobu Kochi, Hiratsuka, Japan

[73] Assignee: Canon Kabushiki Kaisha, Tokyo, Japan

[21] Appl. No.: 08/736,938

[22] Filed: Oct. 25, 1996

[30] Foreign Application Priority Data

Oct. 30, 1995 [JP] Japan .................................. 7-281656
Jan. 16, 1996 [JP] Japan .................................. 8-021659

[51] Int. Cl.$^6$ .................................................. G06G 7/00
[52] U.S. Cl. ............................................................. 708/801
[58] Field of Search ................................... 364/807, 825, 364/606, 607

[56] References Cited

U.S. PATENT DOCUMENTS

| | | | |
|---|---|---|---|
| 4,654,815 | 3/1987 | Marin et al. ........................... | 364/606 |
| 4,885,757 | 12/1989 | Provence .................................. | 364/807 |
| 5,420,806 | 5/1995 | Shou et al. ............................... | 364/606 |
| 5,420,807 | 5/1995 | Shou et al. ............................... | 364/606 |
| 5,565,809 | 10/1996 | Shou et al. ............................... | 364/606 |

FOREIGN PATENT DOCUMENTS

| | | |
|---|---|---|
| 2 536 922 | 11/1982 | France . |
| 2536922 | 6/1984 | France . |

OTHER PUBLICATIONS

Gregorian et al, "Analog MOS Integrated Circuits for Signal Processing" by John Wiley & Sons, Inc., p. 413.
"Economic Majority Logic IC Realized by CMOS", Nikkei Electronics, Nov. 5, 1973, pp. 132–144.

*Primary Examiner*—Tan V. Mai
*Attorney, Agent, or Firm*—Fitzpatrick Cella Harper & Scinto

[57] ABSTRACT

In order to attain a high arithmetic operation precision, small circuit scale, high arithmetic operation speed, and low consumption power in a semiconductor device having multiple input terminals, the terminals, on one side, of capacitance means are connected to the multiple input terminals or one terminal of a capacitance means is commonly connected to a plurality of terminals, the terminals, on the other side, of the capacitance means are commonly connected, and the commonly connected terminal is connected to a sense amplifier via an analog amplifier as needed.

52 Claims, 22 Drawing Sheets

PARALLEL SIGNAL PROCESSING CIRCUIT, SEMICONDUCTOR DEVICE HAVING THE CIRCUIT, AND SIGNAL PROCESSING SYSTEM HAVING THE CIRCUIT

BACKGROUND OF THE INVENTION

1. Field of the Invention

The present invention relates to a parallel signal processing circuit capable of parallel processing a plurality of signals input from a plurality of input terminals, a semiconductor device having the circuit, and a signal processing system having the circuit.

2. Related Background Art

In a conventional semiconductor device that performs parallel arithmetic operation processing, as the number of signals to be subjected to parallel arithmetic operations increases, the circuit scale increases in progression, resulting in an increase in manufacturing cost and a decrease in yield. As the circuit scale increases, the arithmetic operation speed lowers owing to an increase in delay time caused by wiring lines, and an increase in the number of arithmetic operations in the circuit. Furthermore, the consumption power increases considerably.

For example, in the case of a solid-state imaging device shown in FIG. 1, image signals are read out by a scanning circuit from a sensing unit 60 serving as an area sensor constituted by a two-dimensional array of imaging elements 41, and these time-series analog signals are converted into digital signals by an A/D converter 40. The digital signals are temporarily stored in a frame memory 39. The multi-input terminal signals read out from the frame memory 39 are subjected to arithmetic operation processing by an arithmetic operation circuit 38, and the arithmetic operation result is output from an arithmetic operation output circuit 50. More specifically, the moving amount (ΔX, ΔY) of an object can be output by correlation arithmetic operations of data at different times.

However, in order to perform real-time processing of a moving image, the number of processing steps of the arithmetic operation processing is very large, and the circuit scale increases in progression to obtain a real image, resulting in low processing speed. For example, an apparatus that can actually process the MPEG2 method proposed as a moving image compression/expansion method has been under development. Therefore, as the problems of the above-mentioned parallel arithmetic operation processing, the problems of a decrease in arithmetic operation speed, and an increase in consumption power are posed. These problems also cause an increase in manufacturing cost and a decrease in manufacturing yield.

On the other hand, a majority arithmetic operation circuit suitable for a parallel arithmetic operation processing circuit is described in "Economic Majority Logic IC Realized by CMOS", *Nikkei Electronics*, Nov. 5, 1973, pp. 132–144. However, a majority logic circuit is disclosed as one of digital signal processing operations, and is formed by a CMOS circuit. In this case as well, since the number of elements of the CMOS circuit increases, and the number of arithmetic operation processing steps increases, the problem of a decrease in arithmetic operation speed is posed in addition to increases in circuit scale and consumption power.

SUMMARY OF THE INVENTION

It is an object of the present invention to provide a parallel signal processing circuit which can realize a reduction of the circuit scale, an improvement of the arithmetic operation speed, and a reduction of consumption power, a semiconductor device having the circuit, and a signal processing system having the circuit.

It is another object of the present invention to provide a parallel signal processing circuit free from the influence of, e.g., noise and capable of higher-speed processing, a semiconductor device having the circuit, and a signal processing system having the circuit.

It is still another object of the present invention to provide a parallel signal processing circuit which can further reduce the circuit scale by decreasing the number of capacitors, a semiconductor device having the circuit, and a signal processing system having the circuit.

According to the present invention, signals from multiple input terminals are transferred to and stored in capacitors connected in series with each other, and signals based on the charge amounts stored in these capacitances are input to a sense amplifier, thereby realizing parallel signal processing.

According to the present invention, an arithmetic operation result of multiple input signals can be obtained by a simple arrangement, and a reduction of the circuit scale, an increase in arithmetic operation speed, and a reduction of consumption power can be attained.

In particular, since signals are input to the sense amplifier via an analog amplifier means, arithmetic operations free from the influence of, e.g., noise and having high precision can be realized.

Since a plurality of input terminals are connected to one capacitor, the circuit scale can be further reduced.

It is still another object of the present invention to provide a parallel signal processing circuit for performing parallel processing of a plurality of signals input from parallelly connected input terminals, comprising:

switch means provided to the respective input terminals;

capacitance means connected to at least two input terminals via the switch means; and a sense amplifier to which the capacitance means are parallelly connected.

It is still another object of the present invention to provide a parallel signal processing circuit wherein multiple input terminals are connected to capacitance means, terminals, on one side, of the capacitance means are commonly connected, and the commonly connected terminal is input to a sense amplifier via analog amplifier means.

It is still another object of the present invention to provide a parallel signal processing circuit wherein a first circuit has M multiple input terminals to which capacitance means are connected, terminals, on one side, of the capacitance means are commonly connected, the commonly connected terminal is connected to a first input terminal of a second circuit via analog amplifier means, the commonly connected terminal is connected to a second input terminal of the second circuit via a sense amplifier, capacitance means of the second input terminal has a capacitance corresponding to an integer (obtained by rounding up (M/2)) multiple of a capacitance of the capacitance means of the first circuit, and the first input terminal has a capacitance M times the capacitance of the capacitance means of the first circuit.

DESCRIPTION OF THE PREFERRED EMBODIMENTS

The preferred embodiments of the present invention will be described hereinafter with reference to the accompanying drawings as needed.

(First Embodiment)

Figure 1:
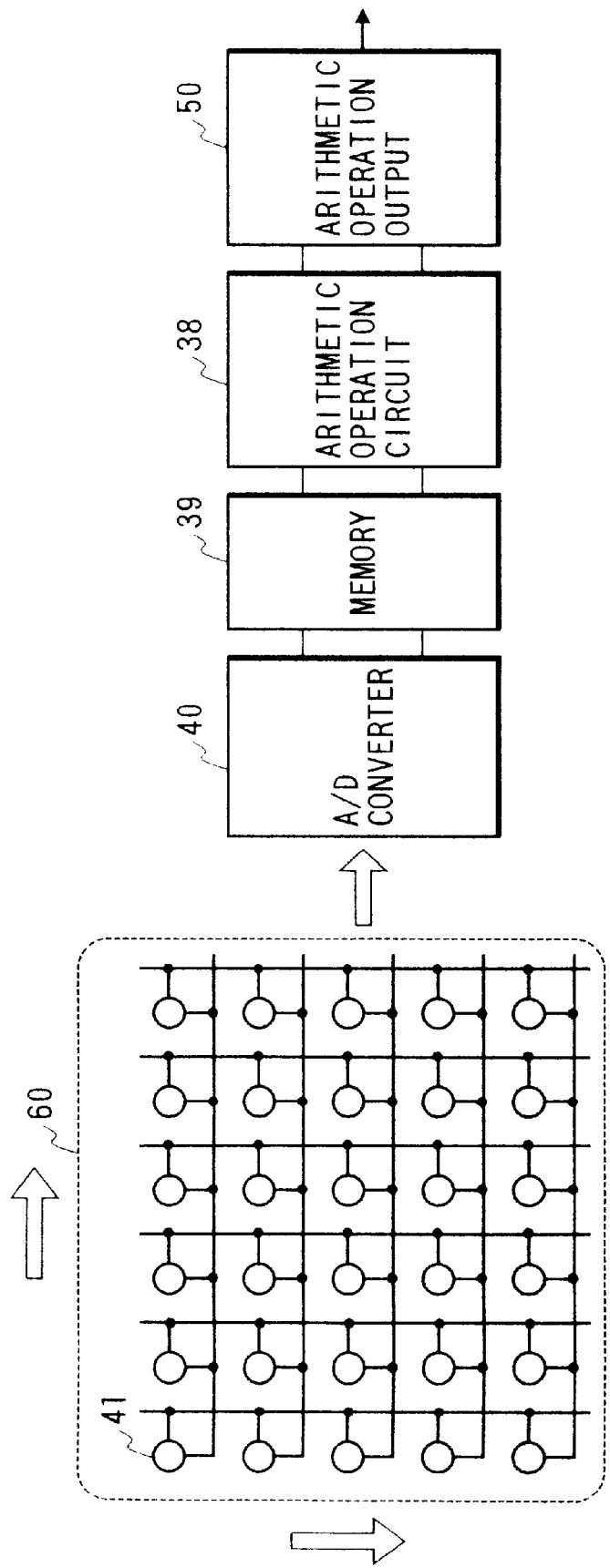
FIG. 1 is a block diagram for explaining an example of an image conversion apparatus.
Figure 2:
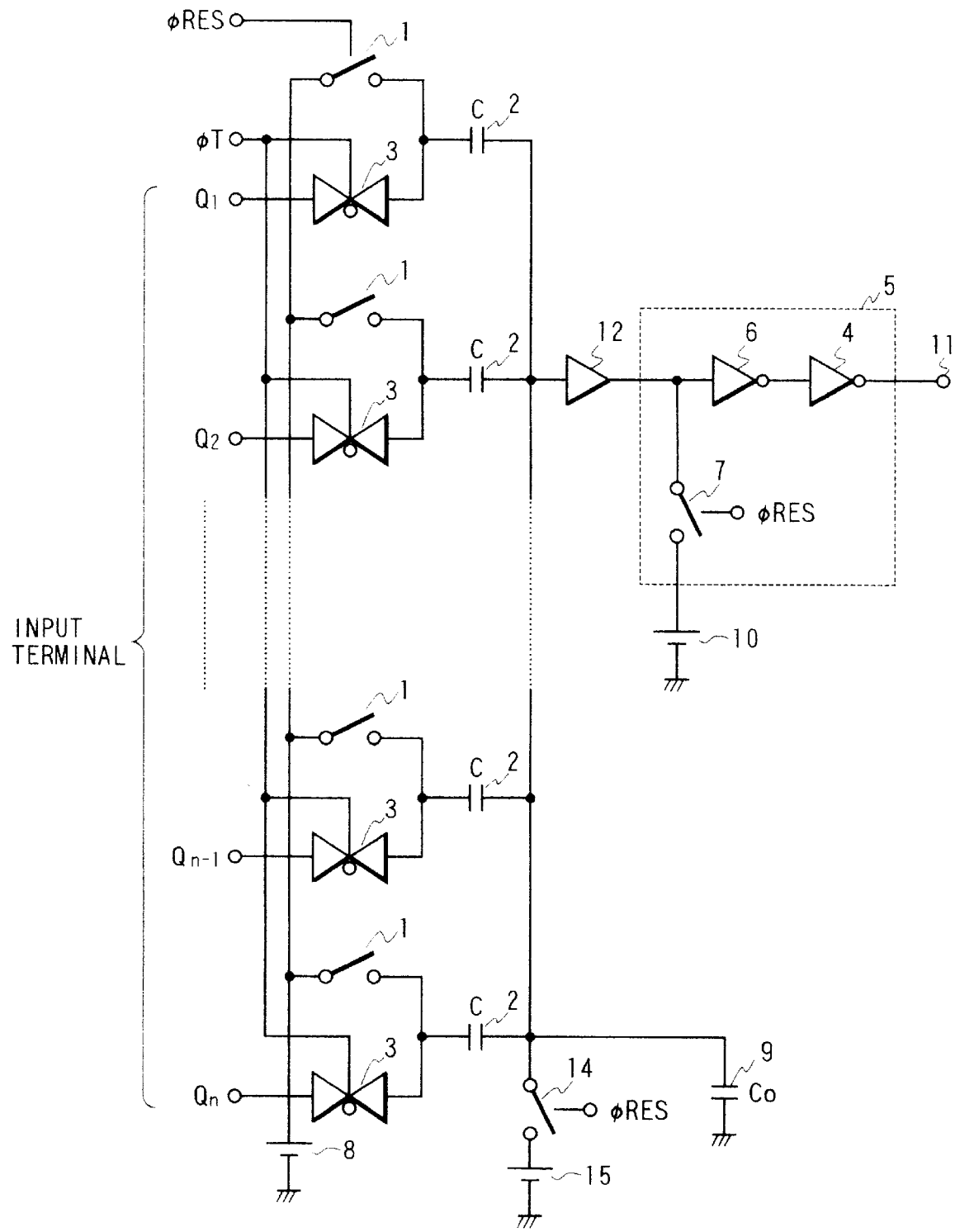
FIGS. 2, 5, 6, 7, 9, 15, 17, 20, 21, and 23 are schematic circuit diagrams for explaining examples of a parallel signal processing circuit according to the present invention.

The first embodiment will be described below with reference to FIGS. 2 to 4. FIG. 2 is a schematic circuit diagram for explaining the arrangement according to the first embodiment of the present invention. Referring to FIG. 2, a circuit comprises first reset switches 1, first capacitors 2, signal transfer switches 3, a second inverter 4 and a first inverter 6 in a sense amplifier 5, a first reset power supply 8, an output terminal 11 of the sense amplifier 5, and a capacitor 9. The capacitor 9 represents a parasitic capacitance Co at one terminal to which the capacitors 2 are commonly connected, but the present invention is not limited to this. Also, the circuit comprises a second reset switch 7 in a sense amplifier 5, a second reset power supply 10, an analog amplifier means 12, a third reset switch 14 for resetting the input terminal of the analog amplifier means, and a third reset power supply 15.

As shown in FIG. 2, input terminals $Q_1$ to $Q_n$ are respectively connected to the signal transfer switches 3. When a transfer pulse ΦT is input from a terminal T, the signal transfer switches 3 are turned on, and the respective signals can be transferred to one terminal of each of the first capacitors 2 serving as capacitances electrically connected to the signal transfer switches 3. The other terminal of each first capacitor 2 is electrically connected to an identical line. This line is connected to the input terminal of the analog amplifier means 12. The output terminal of the analog amplifier means 12 is electrically connected to the input terminal of the sense amplifier 5 having the first and the second inverters 6 and 4. An arithmetic operation result output from the output terminal of the sense amplifier 5 is output from the output terminal 11. Note that the line to which the first capacitors 2 are commonly connected can be connected to the third reset power supply 15 via the third reset switch 14. On the other hand, the line between the analog amplifier means 12 and the input terminal of the sense amplifier 5 can be connected to the second reset power supply 10 via the second reset switch 7.

The lines between the signal transfer switches 3 and the first capacitors 2 are connected to the first reset power supply 8 via the first reset switches 1.

Figure 3:
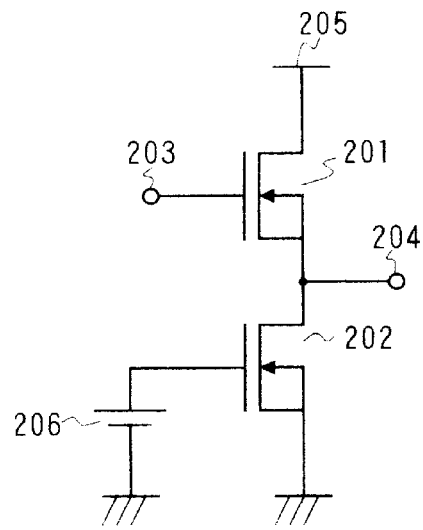
FIG. 3 is a schematic circuit diagram for explaining an example of an analog amplifier means that can be applied to the present invention.

FIG. 3 is a schematic circuit diagram showing an example of the arrangement of the analog amplifier means 12. The analog amplifier means 12 comprises n-type MOS transistors 201 and 202, an input terminal 203 connected to one terminal to which the capacitors 2 are commonly connected, an output terminal 204, a power supply terminal 205, and a bias power supply 206 for applying a constant bias to the gate of the n-type MOS transistor 202.

In this circuit of the analog amplifier means 12, when an input signal input to the input terminal 203 is higher than a threshold value, a HIGH-LEVEL signal is obtained from the output terminal 204; when the input signal is lower than the threshold value, a LOW-LEVEL signal is output. Therefore, this circuit is a source-follower type current amplifier that can obtain an output which is shifted downward by the threshold value voltage of the n-type MOS transistor 201 but has a gain of about unity.

Figure 4:
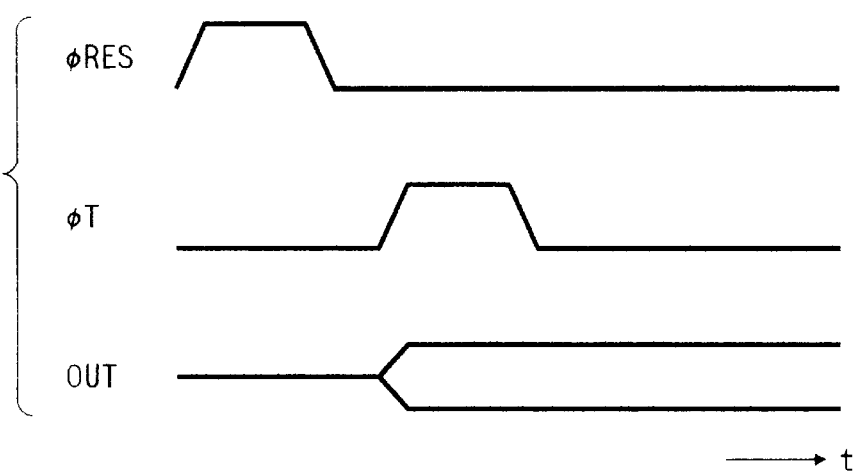
FIGS. 4 and 16 are schematic timing charts for explaining examples of the operation timings of the circuit of the present invention.

FIG. 4 is a timing chart for explaining an example of the operation timings of the circuit of this embodiment. The operation of this embodiment will be described below with reference to FIG. 4. The first reset switches 1 are turned on by a reset pulse ΦRES, and one terminal of each capacitor 2 is reset to the reset voltage of the first reset power supply 8.

When the power supply voltage is a 5 V system, a reset voltage of about 2.5 V half the power supply voltage is used. However, the reset voltage is not limited to this voltage, but other voltages may be used, and a plurality of voltages may also be used. When the first reset switches 1 are turned on, the input terminal of the analog amplifier means 12 is nearly simultaneously reset to the reset voltage of the third reset power supply 15 by turning on the third reset switch 14. At this time, the reset voltage is preferably selected to have a value in the vicinity of a logic inversion threshold value at which the output from the inverter 6 is inverted. For example, when the analog amplifier means 12 comprises the source-follower amplifier shown in FIG. 3, the input terminal of the means 12 is preferably reset to the logic inversion voltage of the inverter 6+the threshold value voltage.

When the reset pulse ΦRES is turned off, the two terminals of each capacitor 2 are held at the corresponding reset potentials. When the transfer switches 3 are turned on by the transfer pulse ΦT, signals are transferred to one terminal to which the capacitors 2 are commonly connected. For example, the potential at one terminal of each capacitor 2 changes from the reset voltage of 2.5 V to VX. For example, assume a case wherein the parasitic capacitance 9 has a capacitance Co, and N capacitors 2 are connected to the input terminal of the analog amplifier means 12. The voltage at one terminal to which the capacitors 2 are commonly connected changes by an amount given by formula (1) below with respect to the input to one capacitor 2 due to capacitive division:

$$|C \times (2.5 - VX)/(N \cdot C + Co)| \qquad (1)$$

When the input voltage of the inverter 6 changes from a value in the vicinity of the logic inversion voltage, the output terminal voltage of the inverter 6 is inverted accordingly. When signals are input to N inputs, the sum of N capacitive division outputs is input to the input terminal of the inverter 6. As a result, if the sum of the N inputs is positive, the input terminal of the inverter 6 shifts to a potential higher than the logic inversion voltage, and a HIGH-LEVEL signal appears at the output terminal 11 of the sense amplifier 5; if the sum is negative, the input terminal of the inverter 6 shifts to a potential lower than the logic inversion voltage, and a LOW-LEVEL signal is output. In the circuit of this embodiment, input signals are multiplied with required weighting coefficients corresponding to processing operations to be performed in accordance with the amplitudes of the input signals and the capacitances of the capacitors 2 to which the signals are input, and the weighted signals are simultaneously subjected to a parallel arithmetic operation in the sense amplifier 5.

In this embodiment, one terminal to which the first capacitors 2 are commonly connected is connected to the sense amplifier 5 via the analog amplifier means 12. For this reason, for example, the inverter 6 generates noise at its input terminal via its own gate capacitance when the voltage at its output terminal is inverted, but the noise does not adversely influence the terminal voltages of the first capacitors 2, and a high-precision logic arithmetic operation can be realized.

In the above description, the case of the amplifier gain=1 has been exemplified. However, the present invention is not limited to this.

From formula (1) above, in this circuit, the amount of change in potential at the input terminal of the inverter 6 decreases as the number of capacitors 2 connected in parallel with each other increases. For example, by increasing the amplifier gain of the analog amplifier means 12, the amount of change in potential at the input terminal of the inverter 6 can be set to be larger than that defined by formula (1). As a result, even when the number of parallel connections increases, an arithmetic operation with higher precision can be realized.

The circuit arrangement of the analog amplifier means is not limited to that of the source-follower amplifier shown in FIG. 3, as a matter of course. For example, various other amplifiers such as a p-type source-follower amplifier, an arithmetic amplifier circuit, and the like may be used.

(Second Embodiment)

Figure 5:
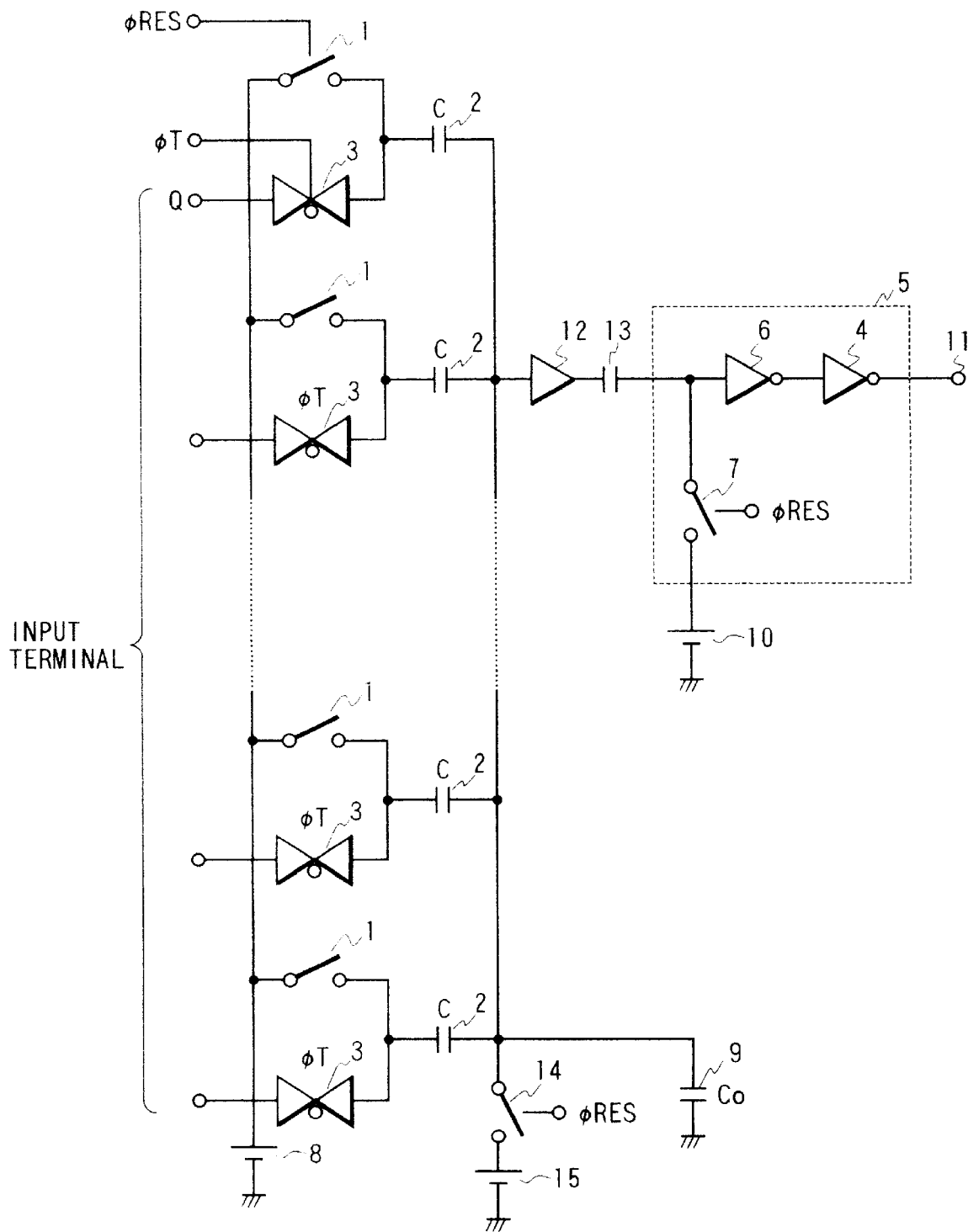

FIG. 5 is a circuit diagram showing the second embodiment of the present invention. Note that the same reference numerals in FIG. 5 denote parts having the same operations or functions as those in FIG. 2. Referring to FIG. 5, the circuit comprises a second capacitor 13, a second reset switch 7 for resetting the input terminal of an inverter 6, and a second reset power supply 10. As shown in FIG. 5, the second capacitor 13 is connected in series between an analog amplifier means 12 and the input terminal of the sense amplifier 5.

The second reset switch 7 operates at roughly the same timing as other reset switches 1 and 14. The analog amplifier means 12 can use the same circuit shown in FIG. 3. In this embodiment, since the analog amplifier means 12 and the inverter 6 are disconnected by the capacitor 13 in a series manner, they can set voltages under optimal conditions. At this time, the input terminal of the inverter 6 is preferably reset to a voltage in the vicinity of the logic inversion voltage by a reset voltage from the second reset power supply 10. On the other hand, the input terminal of the analog amplifier means 12 is preferably reset to a voltage near the center of the dynamic range.

If Gc represents the capacitive division ratio between the capacitor 13 and the parasitic capacitance at the input terminal of the inverter 6, and GA represents the gain of the analog amplifier means, the potential at the input terminal of the inverter 6 changes by an amount given by formula (2) below with respect to the input to one capacitor 2:

$$|Gc \cdot GA\{C \times 2.5 - VX)/(N \cdot C + Co)\}| \quad (2)$$

In this embodiment as well, the switch noise of the output stage of the analog amplifier means 12 does not adversely influence the capacitors 2, and the same switch noise reduction effect as in the first embodiment can be obtained. In addition, the degree of freedom in designing the analog amplifier means 12 increases, and a change in input of the sense amplifier 5 can be discriminated more reliably since the input bias of the inverter 6 can be set independently of the analog amplifier means 12.

(Third Embodiment)

Figure 6:
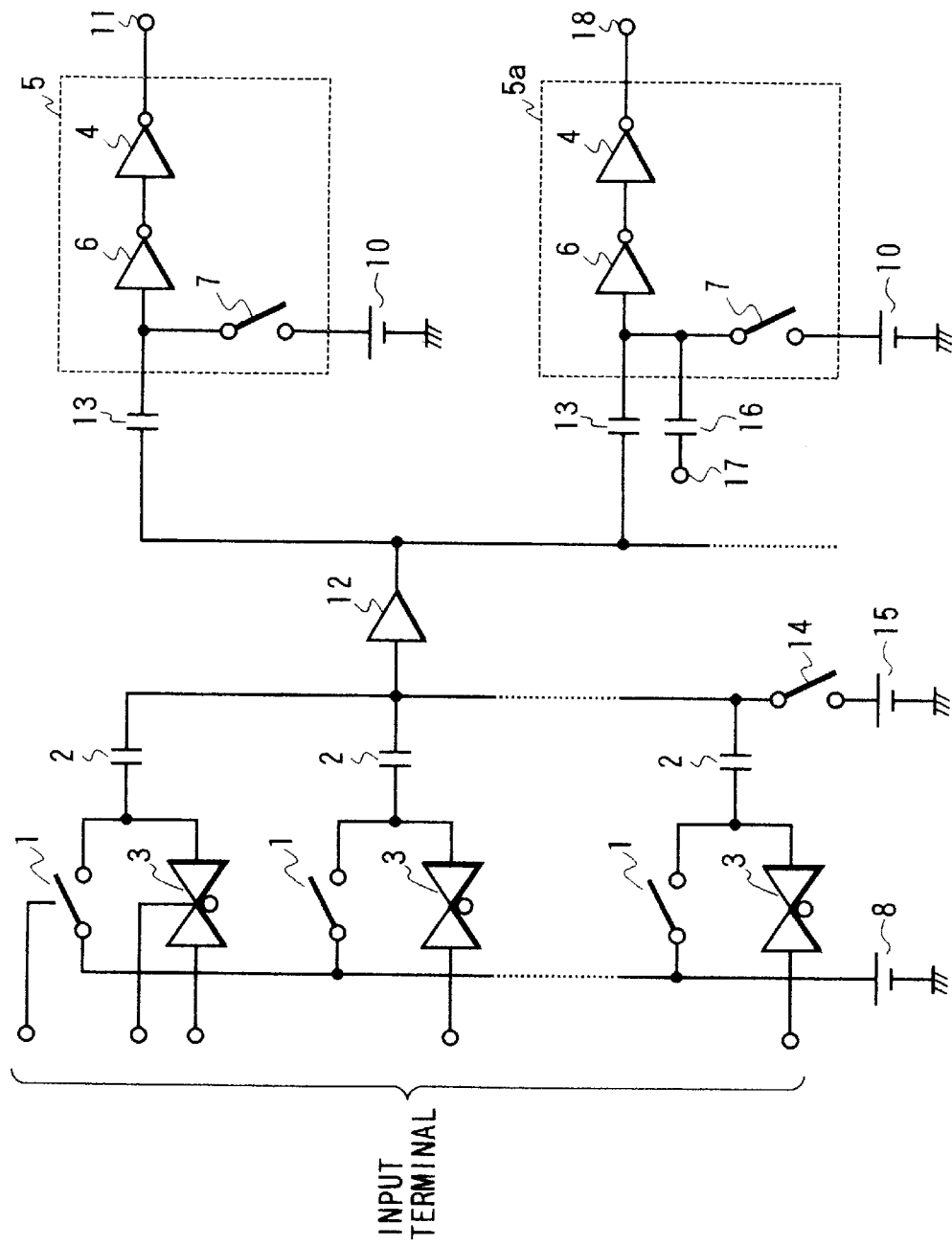

FIG. 6 is a circuit diagram showing the third embodiment of the present invention. Note that the same reference numerals in FIG. 6 denote parts having the same operations or functions as those in FIGS. 2 and 5. Referring to FIG. 6, the circuit comprises a second sense amplifier 5a, a third capacitor 16, a control input terminal 17, and a second output terminal 18.

In this embodiment, the output from the analog amplifier means 12 is connected to a plurality of sense amplifiers 5 and 5a via capacitors, so that majority logic arithmetic operation results can be simultaneously obtained for a set of inputs. When a control signal is independently supplied to the control input terminal, different arithmetic operation results can be obtained from the output terminals 11 and 18.

For example, if Ci represents the input capacitance of each inverter 6, and Cj represents the capacitance of each capacitor 13, the capacitive division ratio Gc of formula (2) at the input terminal of the sense amplifier 5 is given by:

$$Gc = Cj/(Ci+Cj)$$

If Ck represents the capacitance of the capacitor 16, a capacitive division ratio Gc' of formula (2) at the input terminal of the sense amplifier 5a is given by:

$$Gc' = Cj/(Ci+Cj+Ck)$$

In this manner, if ΔV represents a change in signal at the control input terminal 17, the potential at the input terminal of the inverter 6 at the input terminal of the sense amplifier 5 is:

$$|\{Cj/(Ci+Cj)\} \cdot GA \cdot \Sigma \{C \times (2.5-VX)/(N \cdot C+Co)\}| \quad (3)$$

Also, the potential at the input terminal of the inverter 6 at the input terminal of the sense amplifier 5 is:

$$|\{Cj/(Ci+Cj+CK)\} \cdot GA \cdot \Sigma [\{C \times (2.5-VX)/(N \cdot C+Co)\} + \Delta V]| \quad (4)$$

Therefore, at the output terminal 18 of the sense amplifier 18, the signal is further inverted based on a threshold value different from that for the output terminal 11 of the sense amplifier 5 since ΔV is added by the control signal from the control input terminal 17, and for example, two different arithmetic operation results can be obtained for a set of inputs.

At this time, since the potential change amounts applied to the input terminals are voltage current-amplified by the analog amplifier means according to the present invention, a plurality of different arithmetic operation results can be parallelly obtained for a set of inputs, and high-speed processing is attained. Since a plurality of input blocks need not be arranged, a low-cost, low-power circuit can be realized.

(Fourth Embodiment)

Figure 7:
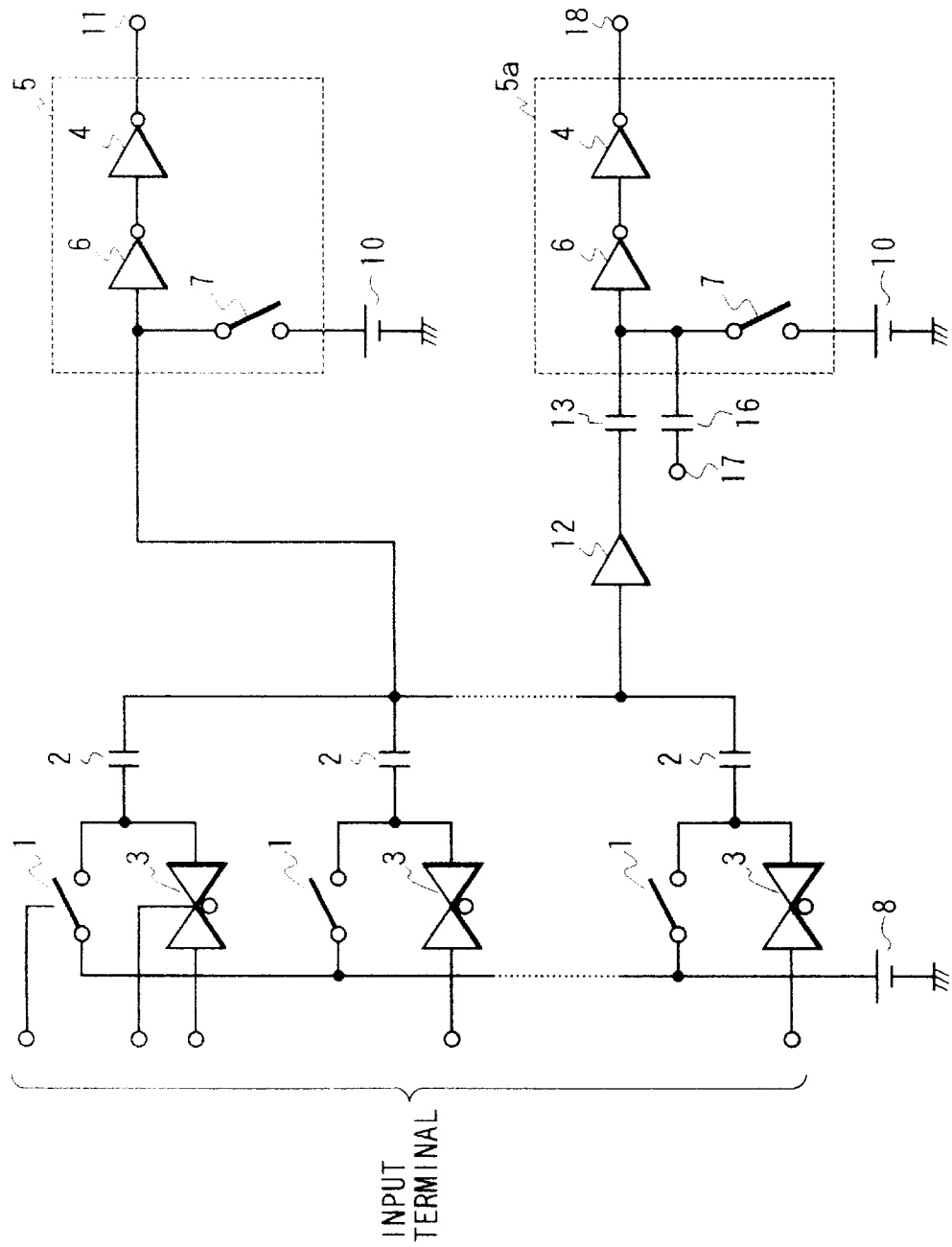

FIG. 7 is a circuit diagram showing the fourth embodiment of the present invention. Note that the same reference numerals in FIG. 6 denote parts having the same operations or functions as those in FIG. 6.

The circuit of this embodiment includes both a circuit portion in which one terminal of each capacitor 2 is connected to the sense amplifier 5 via the analog amplifier means 12, and a circuit portion in which one terminal of each capacitor 2 is directly connected to another sense amplifier 5 without going through the analog amplifier means 12.

In this embodiment, as compared to the third embodiment shown in FIG. 6, the capacitor 13, the reset switch 14, and the reset power supply 15 can be omitted, and the circuit scale can be reduced slightly. In this manner, both the sense amplifier 5 connected to the capacitors via the analog amplifier means and the sense amplifier 5 directly connected to the capacitors can be used.

(Fifth Embodiment)

The fifth embodiment will be described below with reference to the circuit diagram shown in FIG. 8. In this embodiment, a higher-grade parallel arithmetic operation is realized by connecting a plurality of parallel arithmetic operation circuits each comprising a semiconductor device described in the above embodiments.

Figure 8:
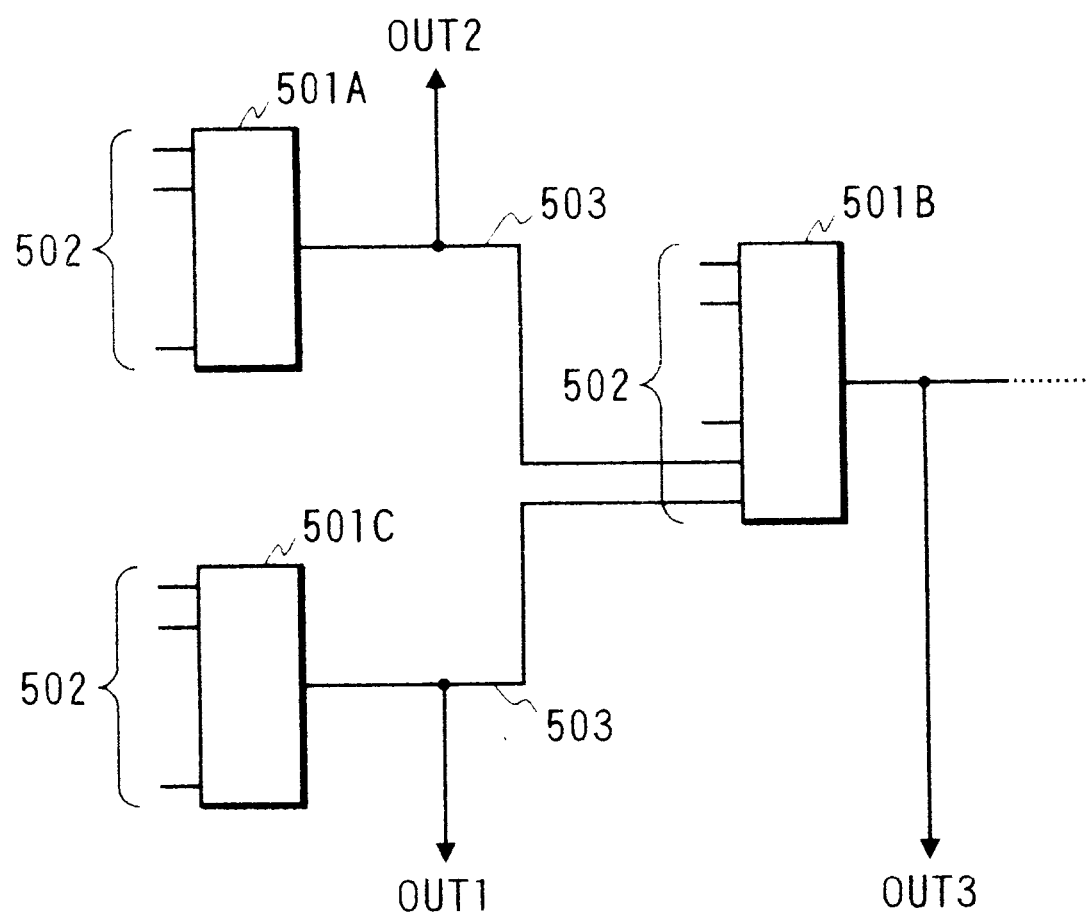
FIGS. 8, 10, 11, 18, 19, and 22 are schematic block diagrams for explaining examples of an arithmetic operation circuit using the parallel signal processing circuit of the present invention.

Referring to FIG. 8, each of parallel arithmetic operation circuit blocks 501A to 501C comprises a circuit which has multiple input terminals 502, and is constituted by transfer switches 3, capacitors 2, a sense amplifier 5, an analog amplifier means 12, and the like, as shown in, e.g., FIG. 2. Output terminals 503 from the sense amplifiers 5 correspond to the output terminal 11 shown in FIG. 2. The output terminals 503 of the parallel arithmetic operation circuit blocks 501A and 501C are connected to the parallel arithmetic operation circuit block 501B, and the output signals output from these output terminals 503 serve as input terminals to the parallel arithmetic operation circuit block 501B. Also, the outputs from similar parallel arithmetic operation circuit blocks are connected to other input terminals of the block 501B.

In the semiconductor circuit with the above arrangement, if each of the parallel arithmetic operation circuit blocks 501A to 501C has a majority determination function, HIGH- or LOW-LEVEL outputs are obtained at terminals OUT1 and OUT2 in correspondence with the input signals to the parallel arithmetic operation circuit blocks 501A and 501C, and an output signal obtained by adding the output signals at the terminals OUT1 and OUT2 to other input signals is obtained at a terminal OUT3 of the parallel arithmetic operation circuit block 501B. In this manner, since a plurality of parallel arithmetic operation circuit blocks according to the present invention are connected in series or parallel with each other or in combination of series and parallel connections, high-grade parallel arithmetic operation processing can be realized.

In this embodiment, the connections of the three parallel arithmetic operation circuit blocks have been exemplified. Of course, the present invention is not limited to this, and the circuit blocks can be freely combined to realize required arithmetic operation processing. Also, the parallel arithmetic operation circuit blocks according to the present invention may be combined with conventional semiconductor logic circuit blocks, needless to say.

In this embodiment, the connections used when signals are transferred in turn have been exemplified. The present invention is not limited to this, and the outputs from the output-side stages may be used as input signals of the input-side stages.

(Sixth Embodiment)

Figure 9:
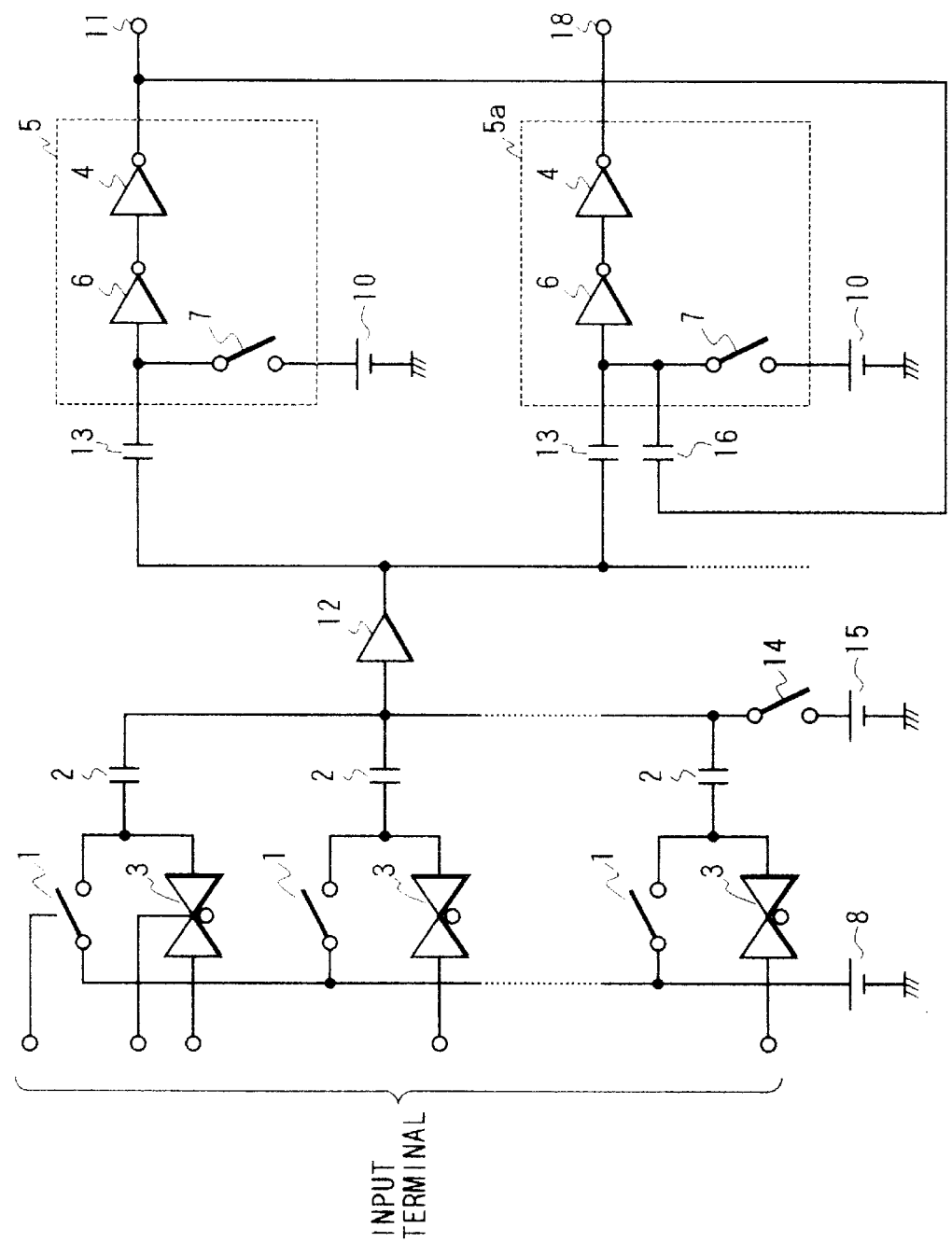

The sixth embodiment will be described below with reference to the circuit diagram shown in FIG. 9. Note that the same reference numerals in FIG. 9 denote parts having the same operations or functions as in FIG. 6. In this embodiment, the output from the sense amplifier 5 is input to one terminal of the third capacitor 16.

As has been described in the third embodiment, the output signal from the output terminal 18 changes in correspondence with the change amount $\Delta V$ of the control signal. In this embodiment, when the change amount $\Delta V$ changes, the sense amplifier 5a is inverted by different inversion threshold values, as can be seen from formula (4) above. More specifically, three different relationships between the change in output signal at the output terminal 11 of the sense amplifier 5, and the change amount $\Delta V$, i.e., $\Delta V=+5$ V when the output signal changes High→Low, $\Delta V=0$ V when the output signal changes High→High, $\Delta V=0$ V when the output signal changes Low→Low, and $\Delta V=-5$ V when the output signal changes Low→High, are obtained when the power supply voltage system is a 5 V system.

When the output signal from one sense amplifier 5 is used as one of inputs of another sense amplifier 5a as another block like in this embodiment, higher-grade parallel arithmetic operation processing can be realized.

In this embodiment, the output signal from the output terminal 11 is directly connected to the capacitor 16. However, the present invention is not limited to this. For example, the output signal from the output terminal 11 may be connected via various types of logic gates, amplifiers, switches, and the likes to realize required arithmetic operation processing, needless to say.

(Seventh Embodiment)

Figure 10:
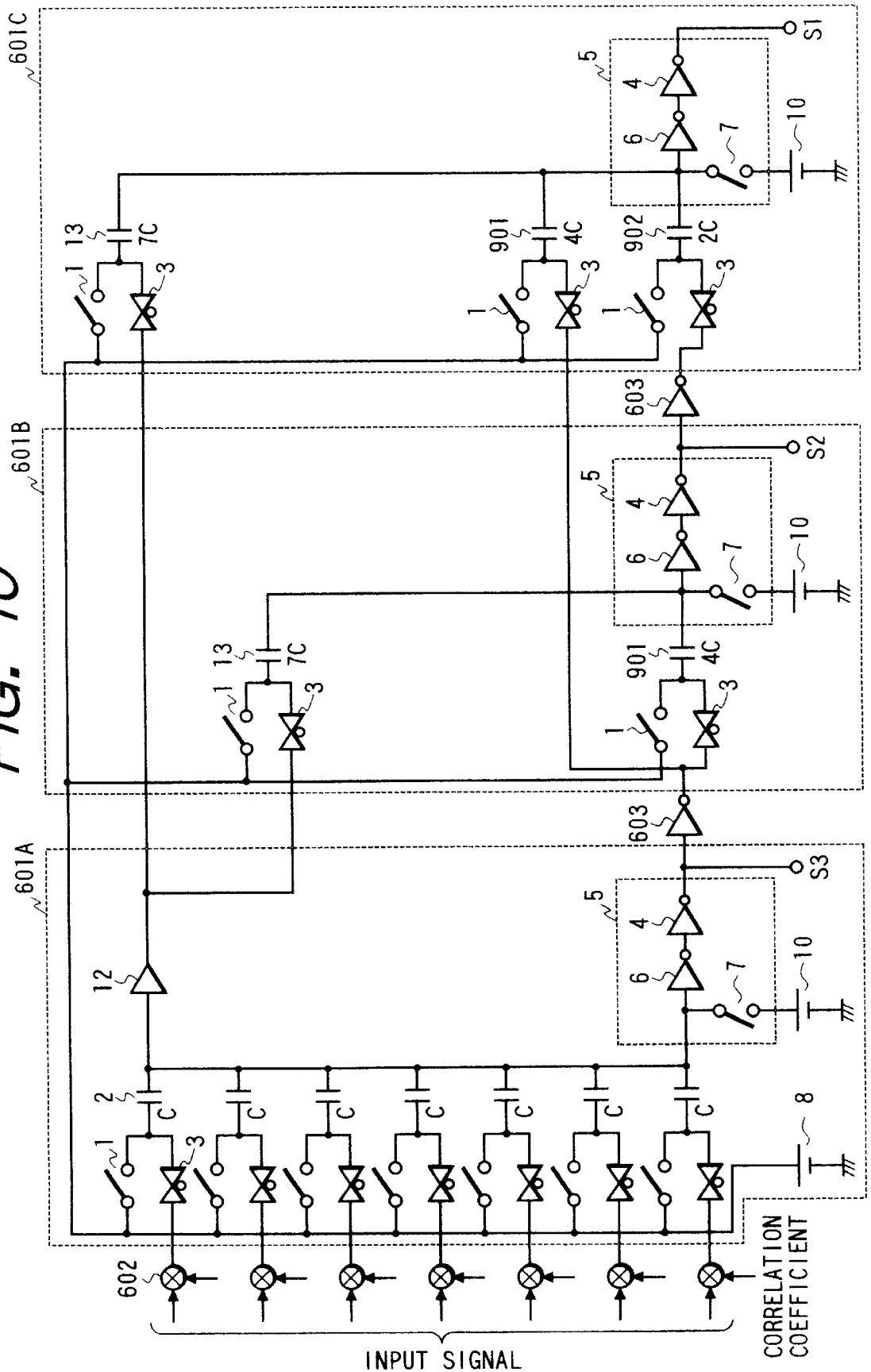

FIG. 10 is a circuit diagram of an embodiment in which the above-mentioned semiconductor device is applied to a correlation arithmetic operation circuit as the seventh embodiment of the present invention. Note that the same reference numerals in FIG. 10 denote parts having the same operations or functions as in FIG. 2.

This circuit compares a plurality of data with reference data, and outputs the sum of correlations as a correlation score using a binary value.

FIG. 10 shows a 7-input correlation arithmetic operation circuit as an example. Referring to FIG. 10, each of majority arithmetic operation circuit blocks 601A to 601C has multiple input terminals, and also has reset switches 1, capacitors 2, signal transfer switches 3, a sense amplifier 5, and the like. Comparators 602 are connected to the block 601A, and inverters 603 are connected between the blocks 601A and 601B, and between the blocks 601B and 601C. The difference between the majority arithmetic operation circuit blocks 601A, 601B, and 601C is that the majority arithmetic operation circuit block 601A actually has seven input terminals, but the majority arithmetic operation circuit blocks 601B and 601C each have one input terminal and one or two control terminals.

Referring to FIG. 10, the input signals are input to the comparators 602 together with correlation coefficients. When the input signal and the correlation coefficient coincide with each other, each comparator 601 outputs a HIGH-LEVEL signal; otherwise, it outputs a LOW-LEVEL signal. Since the majority arithmetic operation circuit block 601A has an arrangement in which a total of capacitances of 7C are commonly connected, when HIGH-LEVEL signals are applied to the capacitances of 4C or more upon inputting the outputs from the comparators 602 to the majority arithmetic operation circuit block 601A, the input terminal of the inverter 6 shifts to a high potential by the logic inversion voltage and a HIGH-LEVEL signal is output to the output terminal 11 of the sense amplifier. Column S3 in Table 1 below summarizes the output values of the majority arithmetic operation circuit block 601A for each number of HIGH-LEVEL signals.

TABLE 1

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

As shown in FIG. 10, the output S3 from the majority arithmetic operation circuit block 601A is inverted by the inverter 603, and the inverted signal is applied to the control input terminal of the majority arithmetic operation circuit block 601A. A capacitor 901 has a capacitance of about 4C (C is a minimum value of each of the capacitors 2 connected to other input terminal routes). Also, a capacitor 13 has a capacitance of about 7C. In the majority arithmetic operation circuit block 601B, capacitances of 11C are commonly connected, the capacitor 901 (4C of these capacitances) receives a signal from the control input terminal that receives a signal based on the output from the majority arithmetic operation circuit block 601A, and the capacitor 13 (7C) receives the output signal from the analog amplifier means 12 that receives a signal based on the capacitance stored in the capacitors of the block 601A.

Assuming that the analog amplifier means 12 has gain=1, if V1 to V7 represent signals input to the capacitors 2, the potential change at the side, connected to the switch 3 of the capacitor 13 (7C) is:

$$\{C(2.5-V1)+C(2.5-V2)+\ldots+C(2.5-V7)\}/7C$$

$$=(1/7)\Sigma(2.5-Vi) \quad (5)$$

($\Sigma$ is the sum of i=1 to 7)
At this time, the potential change at the commonly connected terminal as the other terminal of the capacitor 13 is:

$$\{7C\cdot(1/7)\Sigma(2.5-Vi)+4C(2.5-A)\}/11C$$

$$=\{(2.5-V1)+\ldots+C(2.5-V7)+4(2.5-A)\}/11 \quad (6)$$

(A is the inverted signal of the output S3 from the sense amplifier 5)
As a result, the majority arithmetic operation circuit block 601B serves as a circuit in which capacitances of 11C are commonly connected, a signal from the control input terminal is applied to 4C, and the same input signals as those input to the block 601A are applied to the remaining 7C.

When HIGH-LEVEL signals are applied to 6C or more of all the capacitances, the majority arithmetic operation circuit block 601B determines a majority as a whole, and outputs a HIGH-LEVEL signal.

For example, when the output from the majority arithmetic operation circuit block 601A is at HIGH LEVEL (HIGH-LEVEL signals are applied to 4C or more), a LOW-LEVEL signal is applied to the weighted input terminal, as described above. Furthermore, when HIGH-LEVEL signals are applied to the capacitances of 6C or more of those applied to the input terminal other than the weighted input terminal, the majority arithmetic operation circuit block 601B determines a majority as a whole, and outputs a HIGH-LEVEL signal. When HIGH-LEVEL signals are applied to 4C (inclusive) to 6C (inclusive), the block 601B does not determine a majority, and outputs a LOW-LEVEL signal.

On the other hand, when the output from the majority arithmetic operation circuit block 601A is at LOW LEVEL, a HIGH-LEVEL signal is applied to the weighted input terminal. When HIGH-LEVEL signals are applied to 2C (inclusive) to 3C (inclusive), 4C+2C (4C is a weight), i.e., 6C or more is determined as a majority, and a HIGH-LEVEL signal is output. On the other hand, when HIGH-LEVEL signals are applied to 1C or less, 4C+0 or 4C+C is 6C or less, and a LOW-LEVEL signal is output. Column S2 in Table 1 above summarizes the output values of the majority arithmetic operation block 601B for each number of input HIGH-LEVEL signals.

Also, the majority arithmetic operation circuit block 601C has two weighted terminals respectively having a 4C capacitance value 901 and a 2C capacitance value 902, as shown in FIG. 10. As shown in FIG. 10, the inverted signal of the output S3 from the majority arithmetic operation circuit block 601A is applied to the 4C weighted input terminal, the inverted signal of the output S2 from the majority arithmetic operation circuit block 601B is applied to the 2C weighted input terminal, and substantially the same signals as those input to the block 601A are input to the other input terminals. When the circuit block 601C serves as one in which a total of 13C (7C+2C+4C) capacitors are commonly connected, outputs shown in column S1 in Table 1 above are obtained.

With this circuit arrangement, the number of input signals that coincide with the correlation coefficients can be converted into a 3-digit binary value, and the binary value can be output as a correlation score.

When the above-mentioned circuit arrangement is used, a high-precision correlation arithmetic operation circuit that can attain a reduction of the circuit scale, an increase in arithmetic operation speed, and a reduction of consumption power as compared to the conventional circuit can be realized.

As described above, in the circuit block, in which the terminals, on one side, of capacitor means corresponding to multiple input terminals are commonly connected, and the commonly connected terminal is input to the sense amplifier, a total of the capacitances of the capacitor means is roughly an odd multiple of C (C is a minimum one of the capacitances connected to the multiple input terminals). In this case, a kind of majority arithmetic operation discrimination of an arithmetic operation circuit can be easily attained.

This embodiment has exemplified the 7-input correlation arithmetic operation circuit. Even when the circuit has several ten input terminals, although the initial block basically requires several ten input terminals, the subsequent blocks need only have one input and one or a plurality of control terminals, thus easily realizing conversion of an n-digit binary value. Also, other kinds of correlation arithmetic operation circuits and arithmetic operation processing circuit can be obtained, and the present invention is not limited to these specific circuits.

(Eighth Embodiment)

The seventh embodiment has exemplified a case wherein the amplifier gain of the analog amplifier means 12 is unity, as shown in FIG. 10. If GA represents the gain of the analog amplifier means 12, and CA represents the capacitance of the capacitor 13, equation (6) above is rewritten as:

$$\{CA\cdot GA\cdot(1/7)\Sigma(2.5-Vi)+4C(2.5-A)\}/(CA+4C) \quad (7)$$

At this time, if the gain and capacitances are set to approximate:

$$CA\cdot GA=7C \quad (8)$$

the same function of the correlation arithmetic operation device as in the seventh embodiment can be obtained. In this embodiment, when the amplifier gain is set so that equation (8) holds within the range of CA<C7, the potential change at the input terminal of the inverter 6 can be increased with respect to a change in one input. Since the capacitance of the capacitor 13 can be decreased, its charging time can be shortened, and hence, higher-precision arithmetic operation processing can be attained at higher speed.

Furthermore, if CB represents the capacitance of the capacitor at the control input terminal with respect to the capacitance CA of the capacitor 13, if the following relation holds, the above-mentioned function of the correlation arithmetic operation device can be obtained:

$$CA:CB=7:4 \quad (9)$$

By decreasing both CA and CB while maintaining the above ratio, the charging time of the capacitors can be further shortened, and higher-speed arithmetic operation processing can be realized.

(Ninth Embodiment)

Figure 11:
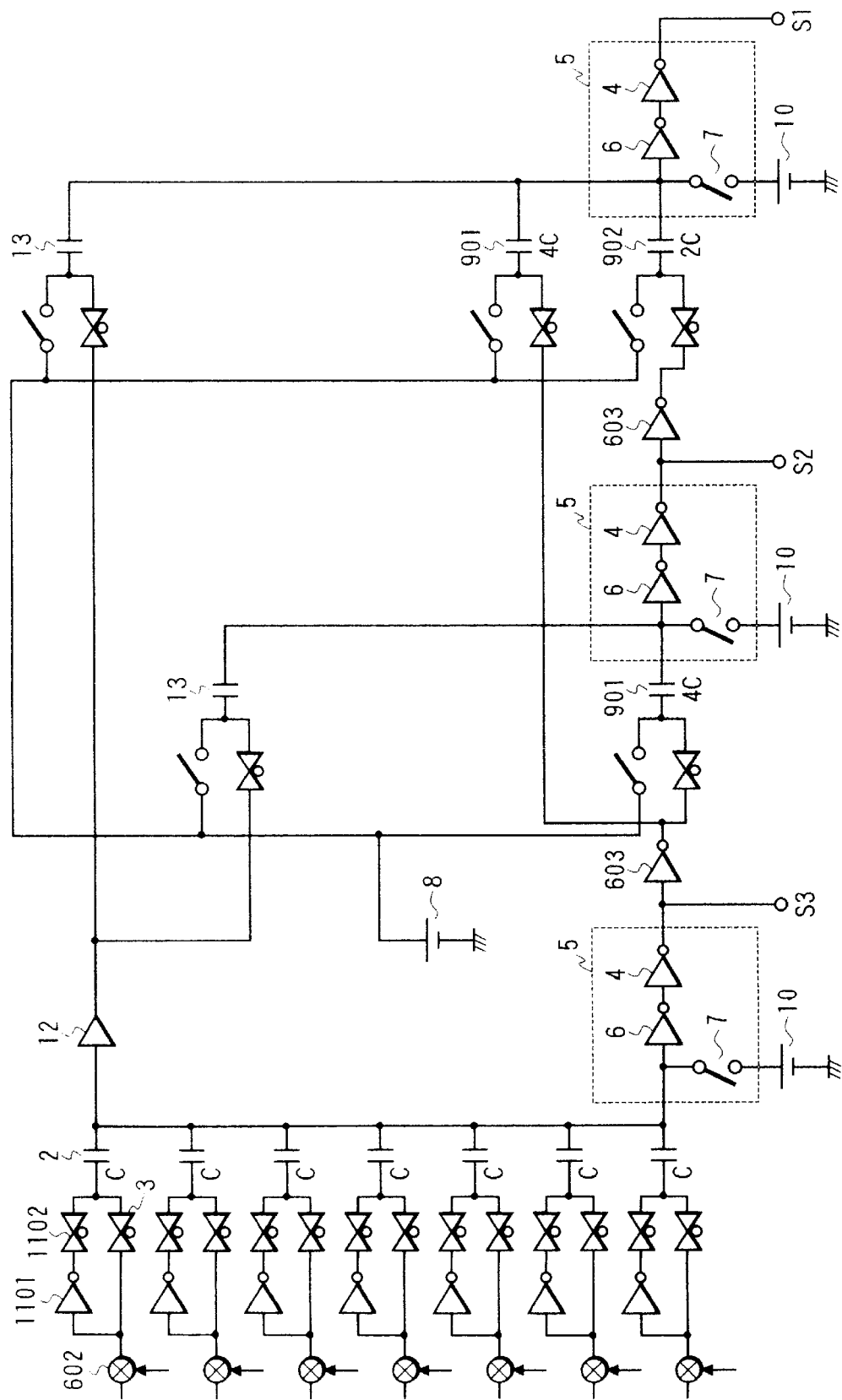

FIG. 11 is a circuit diagram of this embodiment. Note that the same reference numerals in FIG. 11 denote parts having the same operations or functions as in FIG. 10. FIG. 11 shows another embodiment in which the present invention is applied to a correlation arithmetic operation circuit.

Referring to FIG. 11, inverters 1101 and transfer gate switches 1102 are connected between the comparators 602 and the capacitors 2. When the reset switch described in the first embodiment is at HIGH LEVEL, each transfer gate switch 1102 is turned on; otherwise, the transfer switch 3 is turned on.

In this embodiment, since the circuit is reset by the inverted signal of an input signal, when, for example, the power supply voltage system is a 5 V system, a differential voltage between the input signal and the reset signal can be obtained up to 5 V which is twice that in the prior art. In this arrangement, from equation (6), the potential change at the commonly connected terminal of the capacitor 13 is given by the following equation (10):

$$\{7C \cdot (1/7)\Sigma(5-Vi)+4C(2.5-A)\}/11C=\{(5-V1)+\ldots+C(5-V7)+4(2.5-A)\}/11 \quad (10)$$

(A is the inverted signal of the output S3 from the sense amplifier 5, and Σ is the sum of i=1 to 7) In this manner, the values of the capacitors required for meeting the corresponding correlation function can be halved. Therefore, the circuit scale can be reduced accordingly. At this time, if GA represents the gain of the analog amplifier means 12, CA represents the capacitance of the capacitor 13, and CB represents the capacitance of the capacitor 901, the gain and the capacitance are set so that the following relation holds so as to obtain the same function of the correlation arithmetic operation device as in the seventh embodiment:

$$CA \cdot GA:CB=(7/2):4 \quad (11)$$

In this embodiment, since the capacitance of the capacitor 13 can be halved as compared to the seventh and eighth embodiments, the charge accumulation time can be shortened, and a higher-speed circuit operation can be realized.

(Tenth Embodiment)

Figure 12:
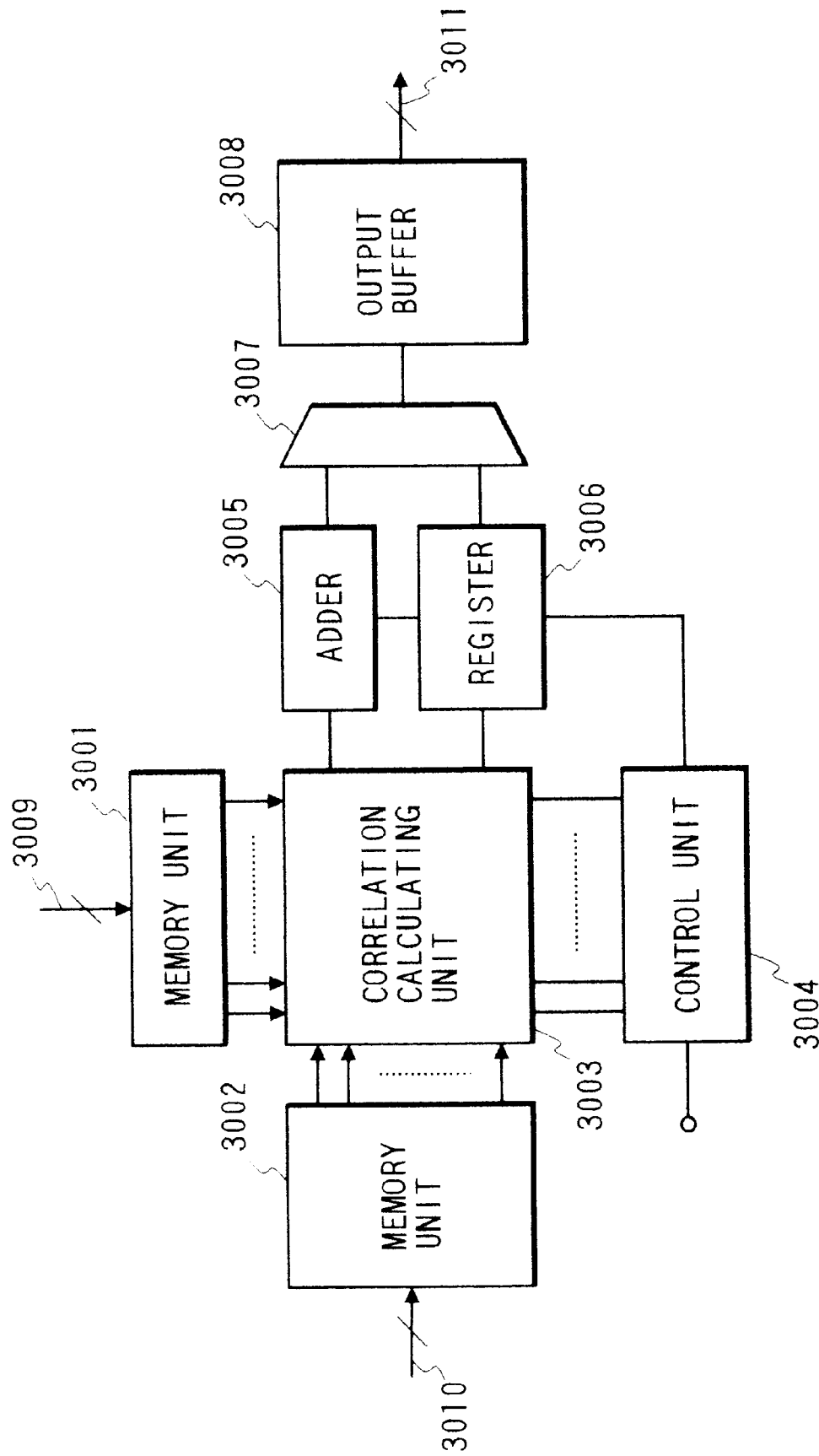
FIGS. 12, 13A, and 14 are schematic block diagrams for explaining examples of a signal processing system that utilizes the parallel signal processing circuit of the present invention.

FIG. 12 shows the tenth embodiment of the present invention. The block diagram of FIG. 12 shows an example of a case wherein a motion detection circuit is realized using the circuit of the present invention. Referring to FIG. 12, the circuit comprises memory units 3001 and 3002 which respectively store reference and comparison data, a correlation calculation unit 3003, a control unit 3004 for controlling the entire chip, an adder 3005 of correlation results, a register 3006 which stores the minimum value of the sums of the adder 3005, a unit 3007 which serves as a comparator and a portion for storing the address of the minimum value, and an output buffer 3008 which also serves as an output result storage unit. A terminal 3009 receives a reference data sequence, and a comparison data sequence to be compared with the reference data sequence is input from a terminal 3010.

The memory units 3001 and 3002 comprise SRAMs, and are constituted by normal CMOS circuits. Data input to the correlation calculation unit 3003 are subjected to parallel processing since the correlation calculation unit 3003 comprises a correlation device of the present invention. Hence, the unit 3003 can attain very high-speed processing, and can be constituted by a small number of elements, thus realizing a small chip size and low cost. The correlation calculation result is scored (evaluated) by the adder 3005, and is compared by the unit 3007 with the contents of the register 3006 that stores the maximum correlation result (the minimum sum) before the above-mentioned correlation calculation. If the current calculation result is smaller than the stored minimum value, the result is newly stored in the register 3006; otherwise, the previous result is held.

With this operation, the maximum correlation result is always stored in the register 3006, and upon completion of calculations of all data sequences, the result is output from a terminal 3011. In this embodiment, the control unit 3004, the adder 3005, the register 3006, the unit 3007, and the output buffer 3008 are constituted by normal CMOS circuits. In particular, the adder 3005 can adopt the circuit arrangement of the present invention to realize parallel additions, thus realizing high-speed processing. As described above, not only high-speed processing and low cost are realized but also the consumption current can be reduced since arithmetic operations are executed on the basis of capacitances via the latch circuits, thus realizing low consumption power. For this reason, the present invention is suitably applied to a portable equipment such as an 8-mm VTR camera or the like.

(Eleventh Embodiment)

Figure 13A:
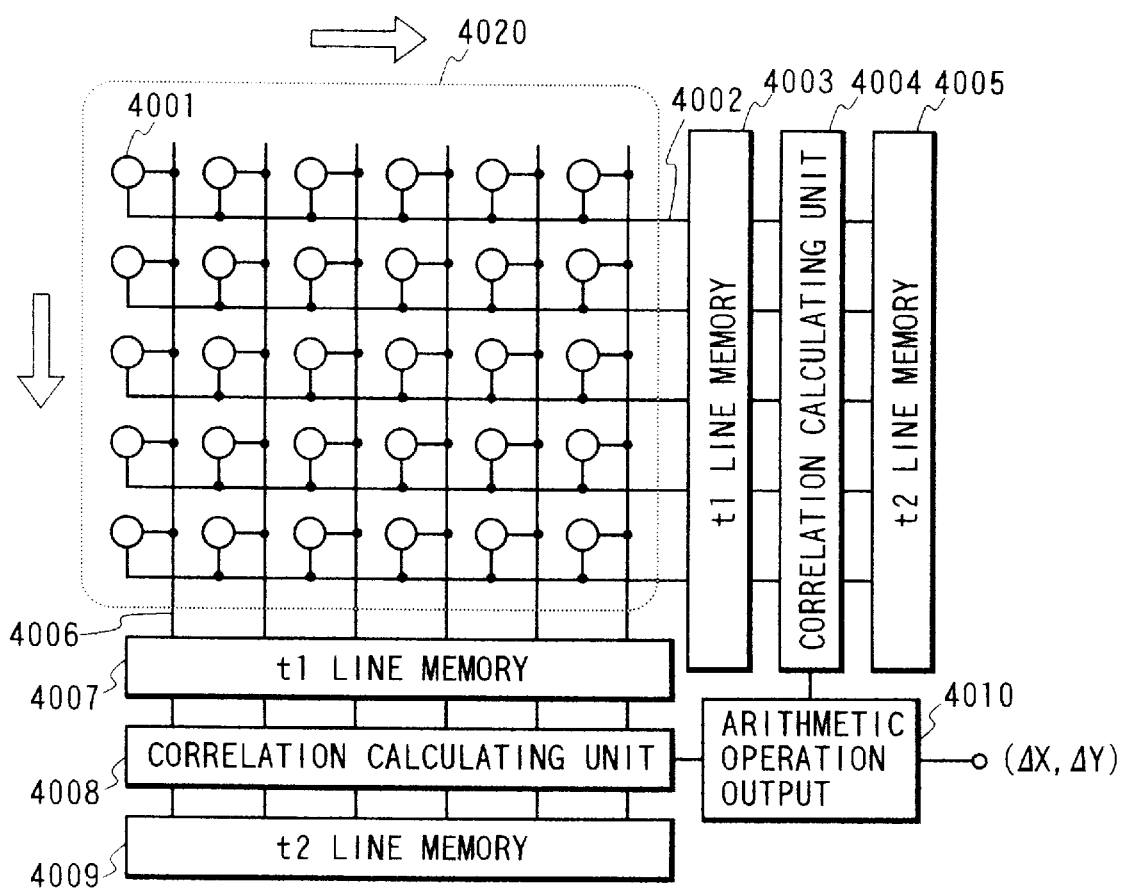
Figure 13B:
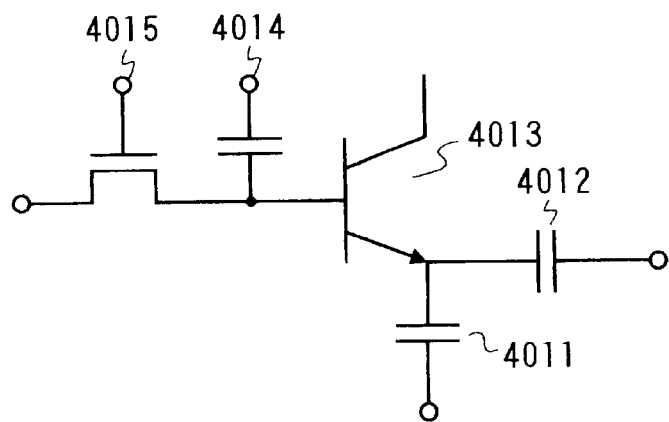
FIG. 13B is a schematic circuit diagram for explaining an example of the arrangement of one pixel portion of a photosensor.
Figure 13C:
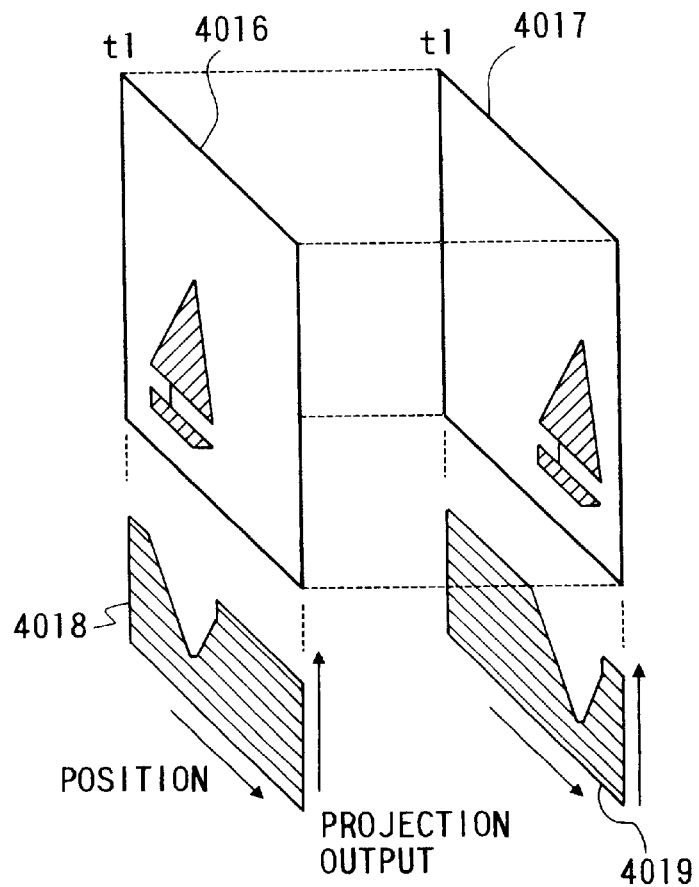
FIG. 13C is an explanatory view for explaining an example of the arithmetic operation contents.

FIGS. 13A to 13C show the eleventh embodiment of the present invention. The eleventh embodiment exemplifies a chip (high-speed image processing device) in which the semiconductor device of the present invention is combined with a photosensor (solid-state imaging element) and high-speed image processing is performed before image data is read out. FIG. 13A is a block diagram showing an example of the overall arrangement, FIG. 13B is a schematic circuit diagram showing an example of the arrangement of a pixel portion, and FIG. 13C is a view for explaining an example of the arithmetic operation contents.

Referring to FIG. 13A, the chip comprises a light-receiving portions 4001, line memories 4003, 4005, 4007, and 4009, correlation calculation units 4004 and 4008, and an arithmetic operation output unit 4010. The light-receiving unit 4001 as one pixel portion shown in FIG. 13B comprises capacitance means 4011 and 4012 for connecting optical signal output terminals and output bus lines 4002 and 4006, a bipolar transistor 4013, a capacitance means 4014 connected to the base region of the bipolar transistor, and a switch transistor 4015. Image data light incident on an image data sensing unit 4020 is photoelectrically converted by the base region of the bipolar transistor 4013.

An output corresponding to the photoelectrically converted photocarriers is read out to the emitter of the bipolar transistor 4013, and raises the emitter potential in correspondence with the output bus line potentials via the capacitance means 4011 and 4012. With the above-mentioned operation, the sum of the outputs from the pixels in the column direction is read out to the line memory 4007, and the sum of the outputs from the pixels in the row direction is read out to the line memory 4003. This allows to output the sums in the X- and Y-directions of regions where the base potentials of the bipolar transistors 4013 are raised via the capacitance means 4014 in the pixel portions.

For example, as shown in FIG. 13C, when an image 4016 is input at time t1, and an image 4017 is input at time t2, output results obtained by respectively adding these images in the Y-direction become image signals 4018 and 4019, and these data are respectively stored in the line memories 4007 and 4009 shown in FIG. 13A. As can be seen from the image signals 4018 and 4019 shown in FIG. 13C, the data of the two images shift in correspondence with the motion of the image, and when the correlation calculation unit 4008 calculates the shift amount, the motion of an object on the two-dimensional plane can be detected by a very simple method.

The correlation calculation units 4004 and 4008 shown in FIG. 13A can comprise the correlation arithmetic operation circuit of the present invention. Each of these units has a smaller number of elements than the conventional circuit, and, in particular, can be arranged at the sensor pixel pitch. The above-mentioned arrangement performs arithmetic operations based on analog signals obtained by the sensor. However, when A/D conversion circuits are inserted between the line memories and the bus lines, digital correlation arithmetic operations can be realized. The sensor of the present invention comprises a bipolar transistor. However, the present invention is also effective for a MOS transistor or only a photodiode without arranging any amplification transistor.

Furthermore, the arrangement of this embodiment performs a correlation arithmetic operation between data sequences at different times. Alternatively, when the X- and Y-projection results of a plurality of pattern data to be recognized are stored in one memory, pattern recognition can also be realized.

As described above, when the pixel input unit and the present invention are combined, the following effects are expected.

(1) Since data which are parallelly and simultaneously read out from the sensor are subjected to parallel processing unlike in the conventional processing for serially reading out data from the sensor, high-speed motion detection and pattern recognition processing can be realized.

(2) Since a 1-chip sensor can realize image processing without increasing the size of peripheral circuits, the following high-grade function products can be realized with low cost: control for turning the TV screen toward the user direction, control for turning the wind direction of an air conditioner toward the user direction, tracing control for an 8-mm VTR camera, label recognition in a factory, a reception robot that can automatically recognize a person, an inter-vehicle distance controller for a vehicle, and the like.

The combination of the image input unit and the circuit of the present invention has been described. The present invention is effective not only for image data but also for, e.g., recognition processing of audio data.

(Twelfth Embodiment)

Figure 14:
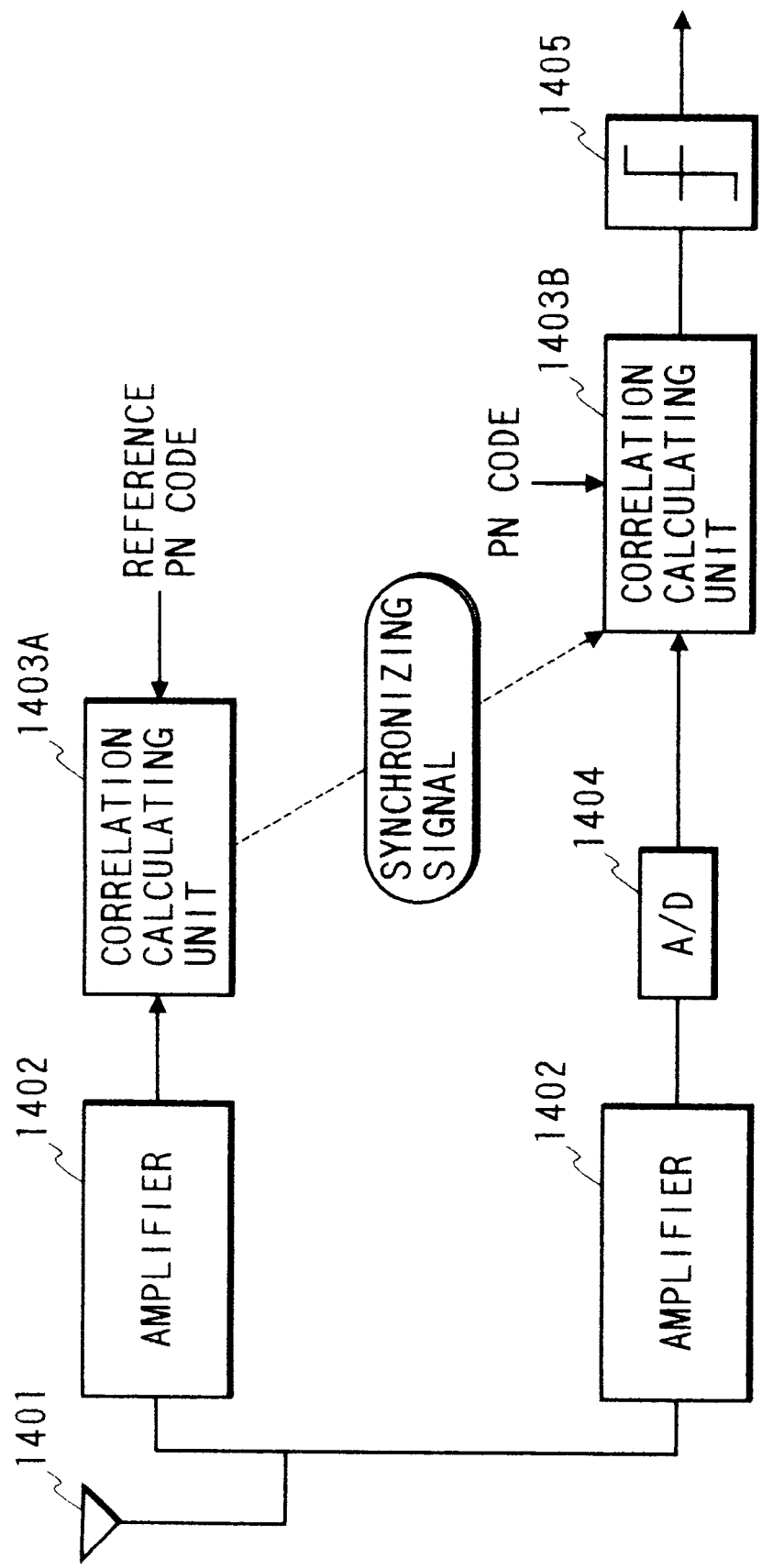

FIG. 14 is a block diagram showing the twelfth embodiment of the present invention. In the twelfth embodiment, the correlation arithmetic operation circuit unit of the present invention is applied to a reception circuit for spread spectrum (SS) communications. Referring to FIG. 14, the reception circuit comprises a reception antenna 1401, a signal demodulation unit 1406, signal amplifiers 1402, correlation calculation circuit units 1403A and 1403B, an A/D conversion circuit unit 1404, and a discriminator 1405.

In SS communications, a signal is converted into a multi-bit code called a PN (Pseudorandom Noise) code, and the PN code is transmitted. The receiver side compares the received signal with a similar PN code prepared in advance, and demodulates the received signal by detecting a highest correlation state.

Referring to FIG. 14, a signal received by the antenna 1401 is temporarily primary-demodulated by the demodulation unit 1406. In this case, the demodulated signal is input to the correlation calculation circuit unit 1403A, and is also input to the correlation calculation circuit unit 1403B after it is converted by the A/D conversion circuit unit 1402 into a digital signal. The signal input from the amplifier 1402 is compared with a PN code held in advance in the receiver side, and the correlation calculation circuit unit 1403A forms a synchronizing signal based on the degree of correlation between the two signals. The correlation calculation circuit unit 1403B calculates the correlation score in synchronism with the formed synchronizing signal. The discriminator 1405 demodulates the signal on the basis of the correlation score output from the correlation calculation circuit unit 1403B.

The SS communication has high privacy and is robust against noise since it converts a signal into a multi-bit code and transmits the converted code. However, since the information amount to be transmitted increases, the load of signal processing becomes heavy. When the correlation calculation circuit unit having multiple input terminals according to the present invention is used, similar processing can be realized at higher speed with a simpler circuit arrangement.

The present invention can be applied to radio communications of portable information equipments using the SS communication technique.

In the above description, a correlation calculation device, and a system using the same have been described. However, the present invention is not limited to them, and may be applied to various logic circuits such as an analog-to-digital converter, a digital-to-analog conversion, an addition circuit, a subtraction circuit, and the like, so as to obtain the same effects as described above.

(Thirteenth Embodiment)

Figure 15:
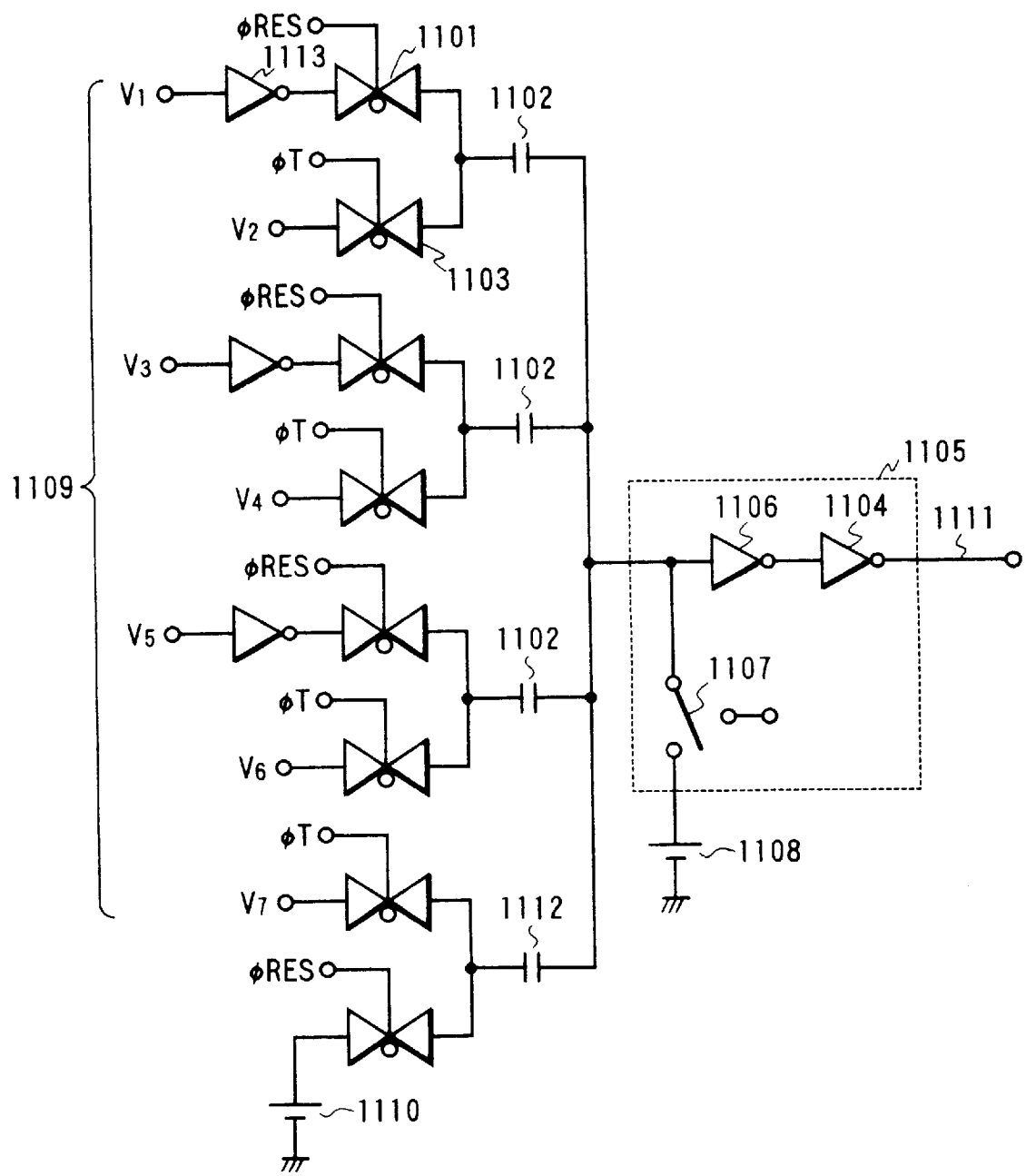

FIG. 15 is a schematic circuit diagram showing the arrangement of a parallel signal processing circuit according to the thirteenth embodiment. This embodiment exemplifies a 7-input parallel signal processing circuit.

Referring to FIG. 15, the circuit comprises reset switches 1101, capacitors 1102, signal transfer switches 1103, a sense amplifier 1105, an inverter 1106 in the sense amplifier 1105, an inverter 1104 in the sense amplifier 1105, and a reset switch 1107 for resetting the input terminal of the inverter 1106.

The circuit also comprises a reset power supply 1108, an output terminal 1111, input terminals 1109, a reset power supply 1110, a capacitor 1112, and inverters 1113.

Figure 16:
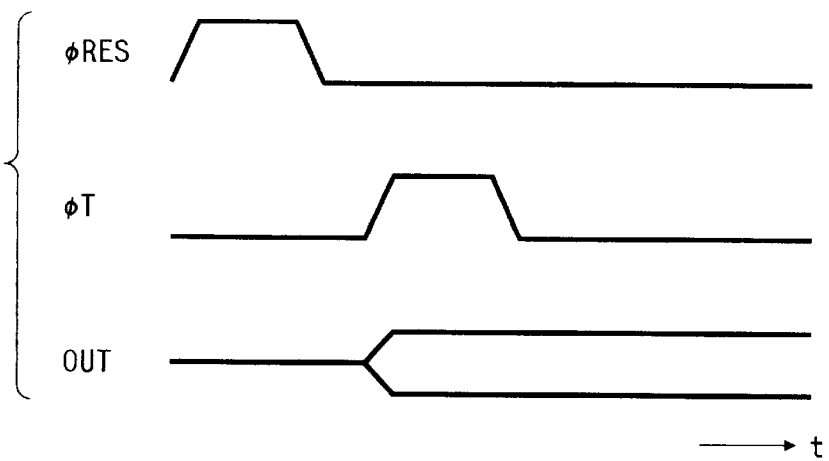

FIG. 16 is a timing chart showing the operation signals of the respective portions. In this embodiment as well, one terminal of the capacitor 1112 is reset by a reset pulse $\Phi$RES. For example, when the power supply voltage is 5 V, the voltage of the reset power supply 1110 is 2.5 V half the power supply voltage. However, the present invention is not limited to this specific reset voltage, but other voltages may be used. At this time, the input terminal of the inverter 1106 in the sense amplifier 1105 is reset by substantially simultaneously turning on the reset switch 1107. As the reset voltage at that time, a value in the neighborhood of the logic inversion voltage at which the output from the inverter 1106 is inverted is selected.

Also, at this time, signals V1, V3, and V5 from the input terminals 1109 are inverted by the inverters 1113, and the inverted signals are input to the corresponding terminals of the capacitors 1102. The signal voltage has H (HIGH) level in the neighborhood of 5 V, and has L (LOW) level in the neighborhood of 0 V. When the reset pulse ΦRES is turned off, the two terminals of the capacitor 1112 are held at the corresponding reset potentials. On the other hand, one terminal of each capacitor 1102 is set at the corresponding signal potential, and the other terminal is set at the reset potential.

When the signal transfer switches 1103 are turned on by a transfer pulse ΦT, signals V2, V4, and V6 are transferred to the corresponding terminals of the capacitors 1102, and a signal V7 is transferred to one terminal of the capacitor 1112. For example, when C represents the capacitance of each of the capacitors 1102 and 1112, the potential at one terminal to which the capacitors 1102 and 1112 are commonly connected changes from the reset potential of the inverter 1106 by a value given by formula (12) below due to capacitive division:

$$\{(V2-(5-V1))+(V4-(5-V3))+(V6-(5-V5))+(V7-2.5)\}C/4C \quad (12)$$

Formula (12) can be rewritten as the following formula (13):

$$1/4 \times \sum_{i=1}^{7} (V_i - 2.5) \quad (13)$$

The input terminal voltage of the inverter 1106 changes with respect to each of the seven inputs in accordance with formula (13) by +⅝ V when the signal is at H level; by −⅝ V when the signal is at L level. The sum of the seven inputs is input to the input terminal of the inverter 1106. When the input terminal voltage changes from the neighborhood of the logic inversion voltage, the output terminal voltage of the inverter 1106 is inverted accordingly. As a result, if the sum of the seven inputs is positive, the input terminal of the inverter 1106 shifts toward a potential higher than the logic inversion voltage, and an H-level signal is output from the output terminal 1111 of the sense amplifier 5; when the sum is negative, the input terminal of the inverter 1106 shifts toward a lower potential, and an L-level signal is output.

In the parallel signal processing circuit of this embodiment, input signals are multiplied with predetermined weighting coefficients corresponding to required signal processing operations in accordance with their amplitudes and the capacitances of the capacitors 1102 to which the signals are input, and the weighted signals are simultaneously subjected to a parallel arithmetic operation by the sense amplifier 1105.

According to the parallel signal processing circuit of this embodiment, since a circuit that receives some signals upon resetting is constituted, and the timing is set, the number of transistors required for constituting the input circuit can be nearly halved. Therefore, the circuit scale can be greatly reduced, and the manufacturing yield can be improved. Also, the circuit scale can be reduced as compared to the conventional circuit arrangement using CMOS elements.

The parallel signal processing circuit according to this embodiment is more effective as the number of inputs increases, since the circuit scale increases in proportion to an increase in the number of inputs. Furthermore, since the number of elements can be reduced, consumption power can be reduced. Also, since the number of elements can be reduced, the load of driving the respective elements can also be reduced, and hence, the arithmetic operation speed can be improved.

Note that the 7-input parallel signal processing circuit has been exemplified. However, the present invention is not limited to this, and the number of inputs can be easily increased. The same operation as in the parallel signal processing circuit of this embodiment can be realized by arranging seven systems of the same input circuits as that for the signal V7 in correspondence with signals V1 to V7. As compared to such arrangement, the parallel signal processing circuit of this embodiment has the above-mentioned effects.

(Fourteenth Embodiment)

Figure 17:
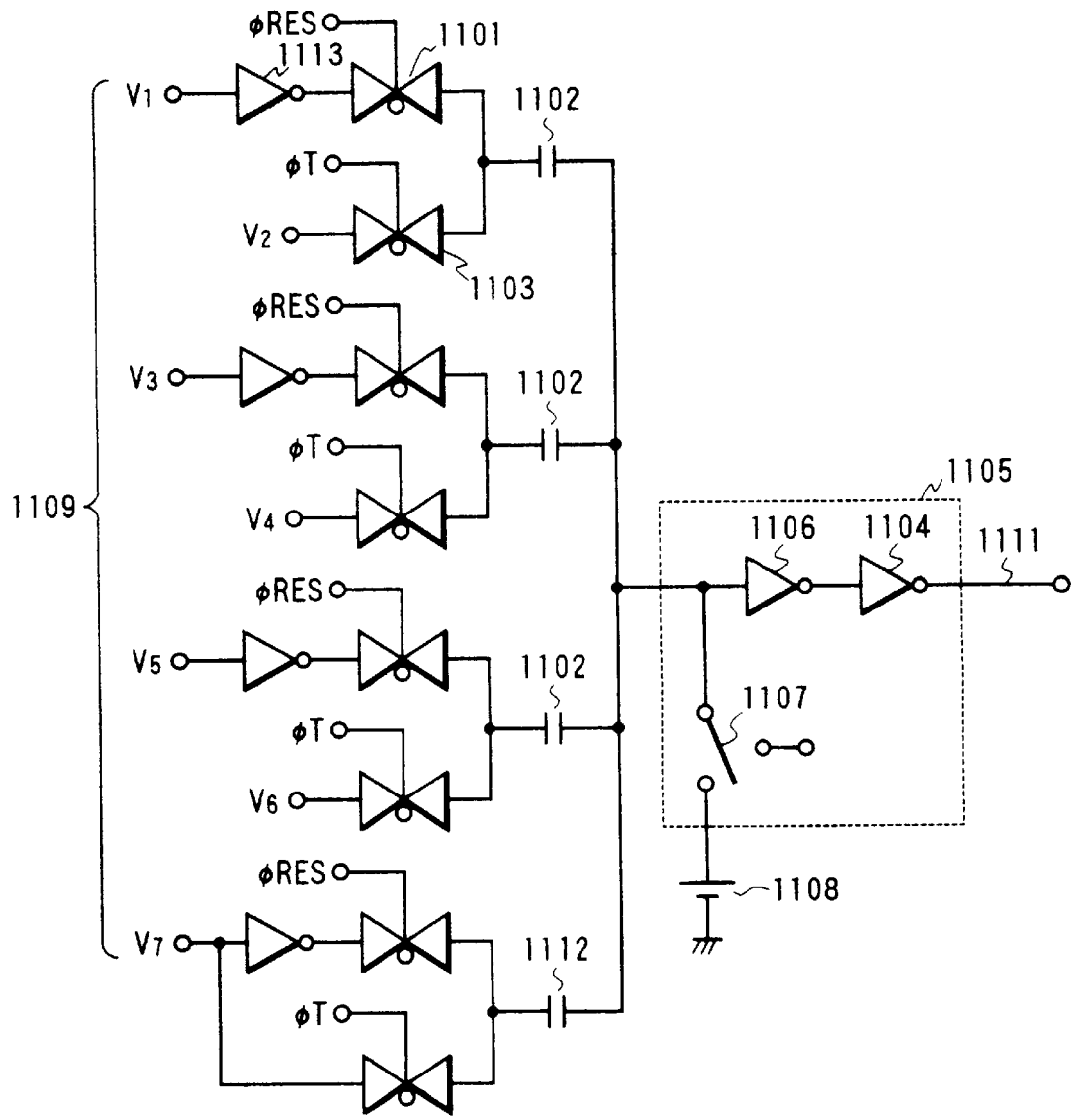

FIG. 17 is a schematic circuit diagram showing the arrangement of a parallel signal processing circuit according to the 14th embodiment. The same reference numerals in FIG. 17 denote the same parts as in the 13th embodiment, and a detailed description thereof will be omitted. In this embodiment, a signal input from the input terminal that receives the signal V7 is input to the capacitor 1112 via the inverter 1113, and is also input thereto via the signal transfer switch 1103 without going through the inverter 1113. Also, in this embodiment, the capacitance of the capacitor 1102 is set to be 2C, and the capacitance of the capacitor 1112 is set to be C half that of the capacitor 1102. With this arrangement, one terminal to which the capacitors 1102 and 1112 are commonly connected changes from the reset potential of the inverter 1106 by a value given by the following formula (14):

$$\{2\times(V2-(5-V1))+2\times(V4-(5-V3))+2\times(V6-(5-V5))+(V7-(5-V7))\}\times C/7C \quad (14)$$

Formula (14) can be rewritten as formula (15):

$$2/7 \times \sum_{i=1}^{7} (V_i - 2.5) \quad (15)$$

Therefore, formula (14) can be rewritten as the same formula as that in the thirteenth embodiment.

Since the parallel signal processing circuit of this embodiment can obtain the same effect as in the thirteenth embodiment without using the reset power supply 1110 which is required in the thirteenth embodiment, the peripheral power supply circuit can be eliminated. Hence, a reduction of the circuit scale, a reduction of consumption power, and improvement of the arithmetic operation speed can be attained.

In this embodiment as well, the 7-input parallel signal processing circuit has been exemplified. However, the present invention is not limited to this, and the number of inputs of the parallel signal processing circuit can be easily increased.

(Fifteenth Embodiment)

Figure 18:
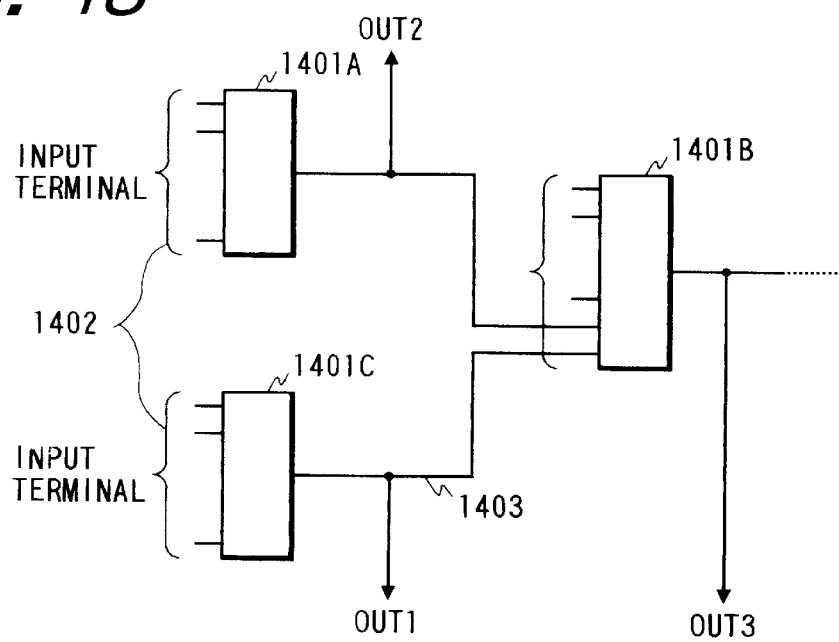

FIG. 18 is a schematic block diagram showing the arrangement of a signal processing apparatus to which a parallel signal processing circuit according to the 15th embodiment is applied. The signal processing apparatus of this embodiment realizes high-grade parallel arithmetic operations by connecting a plurality of parallel arithmetic operation circuits.

Referring to FIG. 18, each of parallel arithmetic operation circuit blocks 1401A to 1401C can adopt the parallel signal processing circuit (see FIG. 15) described in the thirteenth embodiment. More specifically, a parallel signal processing circuit, which has multiple input terminals and is constituted by signal transfer switches 1103, capacitors 1102 and 1112, a sense amplifier 1105, and the like, constitutes one parallel arithmetic operation circuit block. Therefore, input terminals 1402 and an output terminal 1403 of each sense amplifier 1105 respectively correspond to the input terminals 1109 and the output terminal 1111 shown in FIG. 15.

The output terminals 1403 of the parallel arithmetic operation circuit blocks 1401A and 1401C are connected to the input terminals of the parallel arithmetic operation circuit block 1401B, and the output signal output from each output terminal 1403 serves as one input signal to the parallel arithmetic operation circuit block 1401B. The output terminals of similar parallel arithmetic operation circuit blocks are connected to other input terminals of the block 1401B.

In this manner, according to this embodiment, since a plurality of parallel arithmetic operation circuit blocks are connected in series or parallel with each other or in combination of series and parallel connections, high-grade parallel arithmetic operation processing can be realized.

In this embodiment, the connections of the three parallel arithmetic operation circuit blocks have been exemplified. Of course, the present invention is not limited to this, and the circuit blocks can be freely combined to realize required arithmetic operation processing. Also, the parallel arithmetic operation circuit blocks according to the present invention may be combined with conventional semiconductor logic circuit blocks, needless to say.

In this embodiment, the connections used when signals are transferred in turn have been exemplified. The present invention is not limited to this, and the outputs from the output-side stages may be used as input signals of the input-side stages.

(Sixteenth Embodiment)

Figure 19:
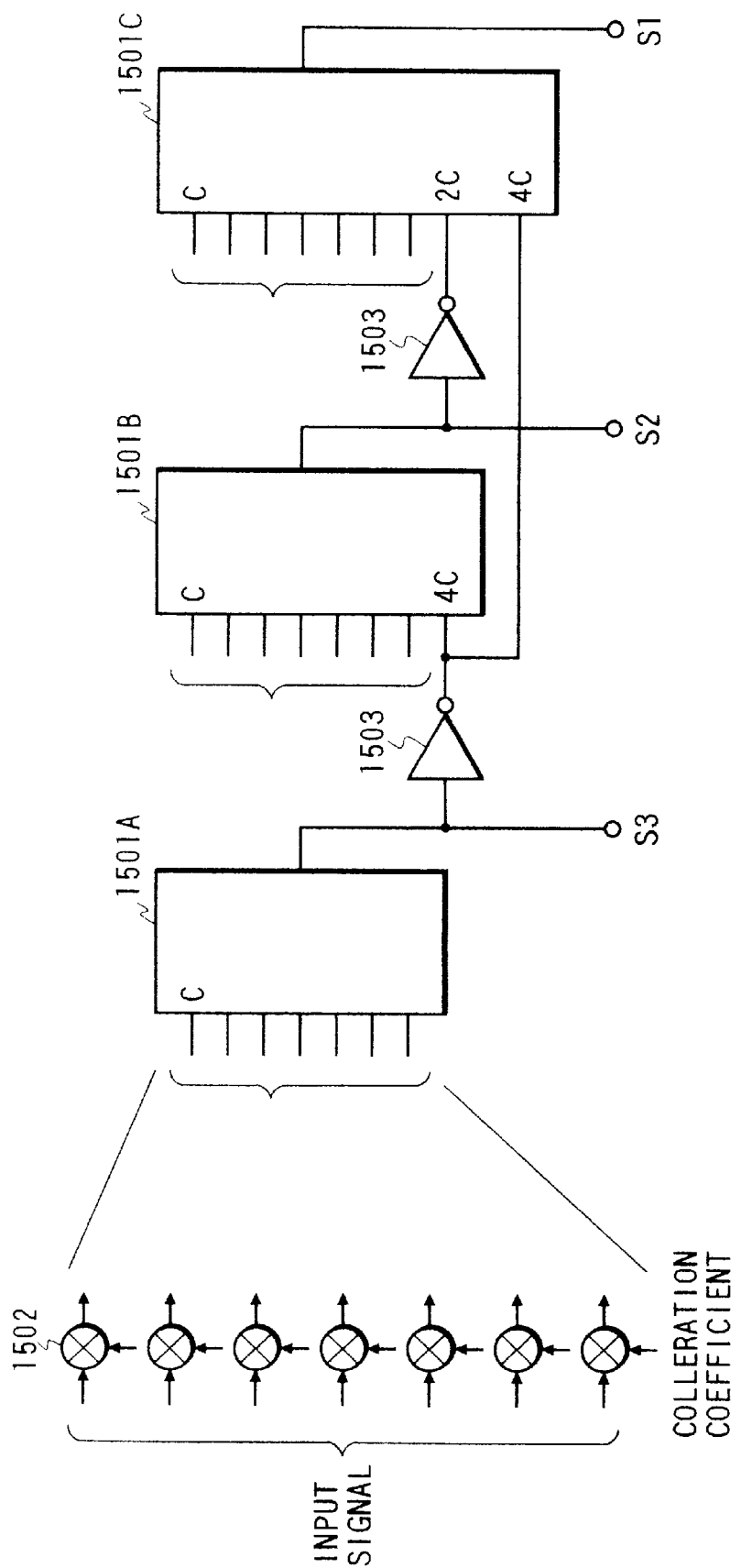
Figure 20:
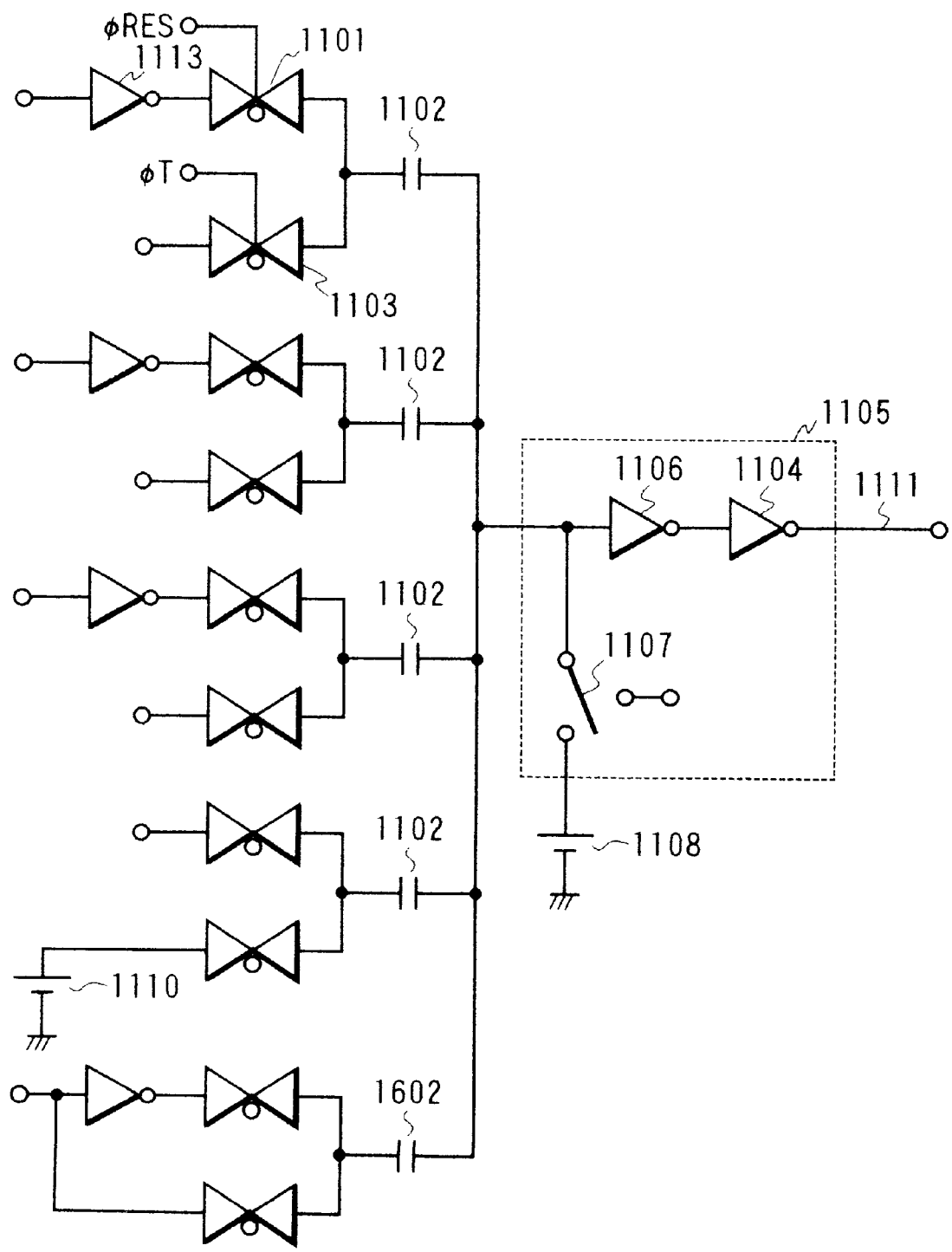
Figure 21:
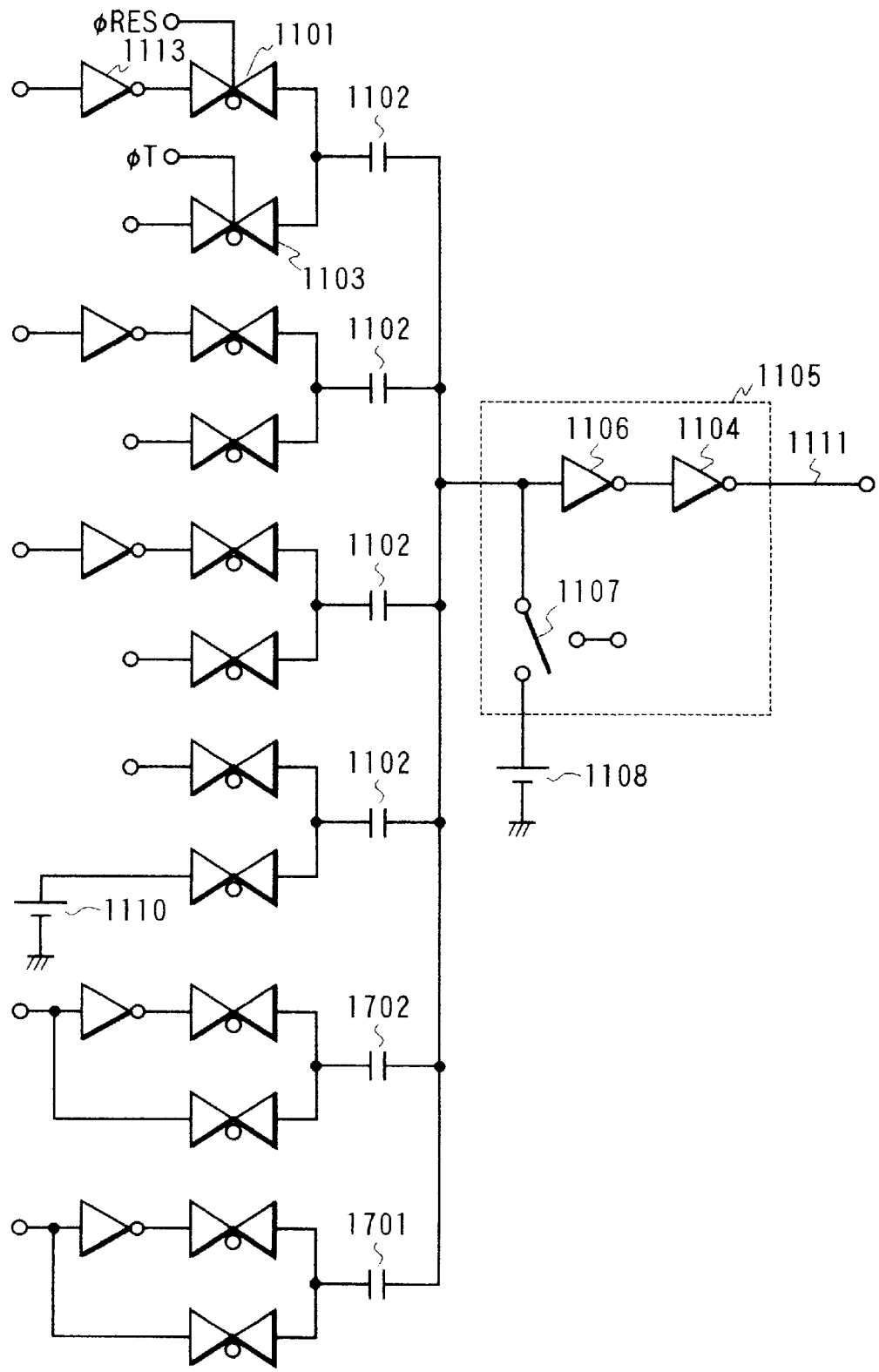

In the sixteenth embodiment, a parallel signal processing circuit of the present invention is applied to a correlation arithmetic operation circuit. FIG. 19 is a schematic block diagram showing an example of the arrangement of the correlation arithmetic operation circuit. Referring to FIG. 19, each of majority arithmetic operation circuit blocks 1501A to 1501C has an arrangement similar to that of the parallel signal processing circuit in the thirteenth embodiment, which has multiple input terminals, and is constituted by reset switches 1101, capacitors 1102, signal transfer switches 1103, a sense amplifier 1105, and the like. The majority arithmetic operation circuit block 1501A comprises a parallel signal processing circuit as shown in FIG. 15. FIG. 20 is a schematic circuit diagram showing an example of the arrangement of the majority arithmetic operation circuit block 1501B. FIG. 21 is a circuit diagram showing the arrangement of the majority arithmetic operation circuit block 1501C. The circuit shown in FIG. 19 comprises comparators 1502 and inverters 1503. The final stage of the input terminals of the block 1501B, and the final two stages of the input terminals of the block 1501C are connected to weighted terminals which have lines for respectively inputting input signals to capacitors 1602, 1701, and 1702 via the inverters 1113 and inputting the input signals to the capacitors 1602, 1701, and 1702 via the signal transfer switches 1103 without going through the inverters 1113.

A plurality of input signals are respectively compared with correlation coefficients by the comparators 1502. When the input signal coincides with the corresponding correlation coefficient, each comparator 1502 outputs an H-level signal; otherwise, it outputs an L-level signal. The outputs from the comparators 1502 are input to the majority arithmetic operation circuit block 1501A. For example, when the outputs from the comparators 1502 are input to the 7-input majority arithmetic operation circuit block 1501A, if H-level signals are in the majority, i.e., if four or more out of the seven inputs are H-level signals, the majority arithmetic operation circuit block 1501A outputs an H-level signal.

Similarly, for example, an 11-input majority arithmetic operation circuit block outputs an H-level signal when six or more inputs are H-level signals; a 9-input majority arithmetic operation circuit block outputs an H-level signal when five or more inputs are H-level signals. Table 2 below summarizes the output values of the majority arithmetic operation circuit block in correspondence with the number of inputs. The output values of the 7-input majority arithmetic operation circuit block 1501A are summarized in column S3 in Table 2.

TABLE 2

| Input | S3 | S2 | S1 |
| --- | --- | --- | --- |
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

The output from the 7-input majority arithmetic operation circuit block 1501A is inverted by the inverter 1503, and the inverted output is applied to the weighted input terminal of the majority arithmetic operation circuit block 1501B shown in FIG. 20.

Referring to FIG. 20, the capacitor 1602 has a capacitance about four times that of the capacitors 1102 and 1112 connected to the input terminal routes. In the 11-input majority arithmetic operation circuit block 1501B, if C represents the capacitance of each capacitor connected to the input terminal route, 11 capacitances C are commonly connected, four capacitances C of them receive a signal from the weighted input terminal, and the remaining seven input terminals receive the same signals as that input to the majority arithmetic operation circuit block 1501A.

For example, when four or more out of the seven inputs are H-level signals, an L-level signal is applied to the weighted input terminal, as described above. When six or more out of the seven inputs of signals applied to the input terminals other than the weighted input terminal are H-level signals, the 11-input majority arithmetic operation circuit block 1501B as a whole determines a majority, and outputs an H-level signal. On the other hand, when four or more or five or less out of the seven inputs are H-level signals, the block 1501B outputs an L-level signal since it does not determine a majority.

On the other hand, when three or less out of the seven inputs are H-level signals, an H-level signal is applied to the weighted input terminal. In this case when two or more or three or less out of the seven inputs are H-level signals, 4+2 (4 is the weight) or 4+3 (4 is the weight) yields 6 or more, and a majority is determined, thus outputting an H-level signal. However, when one or less input is an H-level signal, 4+0 or 4+1 yields less than 6, and an L-level signal is output.

In this manner, the output values of the majority arithmetic operation circuit block 1501B in correspondence with the number of H-level inputs are summarized in column S2 in Table 2 above.

Also, the majority arithmetic operation circuit block 1501C comprises two weighted terminals which respectively have the capacitor 1701 having a capacitance four times of C, and the capacitor 1702 having a capacitance twice of C, as shown in FIG. 21. The 4C weighted terminal shown in FIG. 21 receives an inverted signal of the output signal from the majority arithmetic operation circuit block 1501A, the 2C weighted terminal receives an inverted signal of the output from the majority arithmetic operation circuit block 1501B, and the remaining seven input terminals receive the same input signals as those input to the majority arithmetic operation circuit block 1501A. In this manner, when this block 1501C operates as a total of 13-input (=7+2+4) majority arithmetic operation circuit block, outputs shown in column S1 in Table 2 above are obtained.

According to the correlation arithmetic operation circuit of this embodiment, the number of input signals that coincide with the correlation coefficients can be converted into a 3-digit binary value, as shown in Table 2. Therefore, a correlation arithmetic operation circuit that can reduce the circuit scale, allows higher-speed arithmetic operations, and requires smaller consumption power as compared to the conventional circuit can be realized.

(Seventeenth Embodiment)

Figure 22:
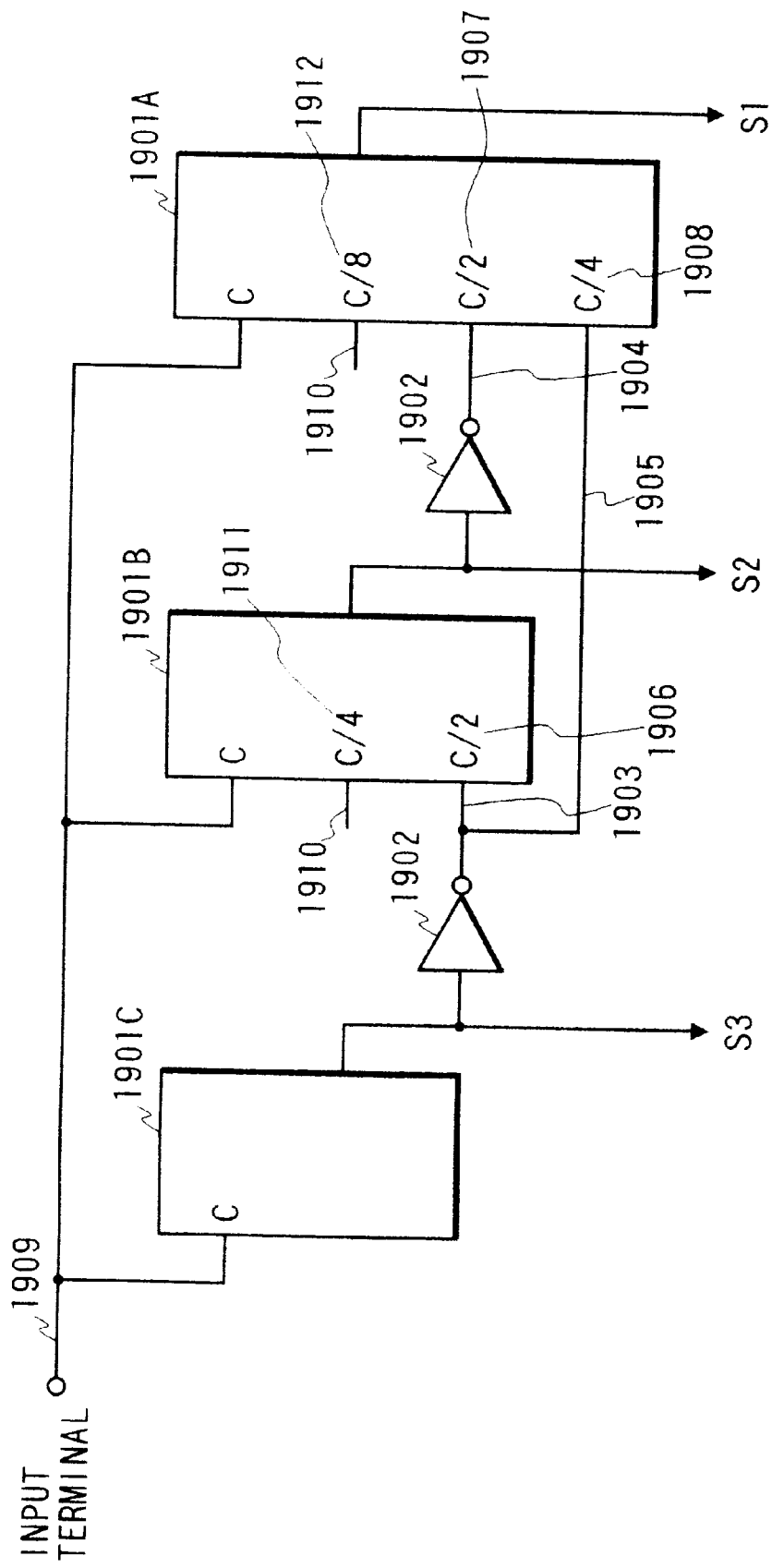
Figure 23:
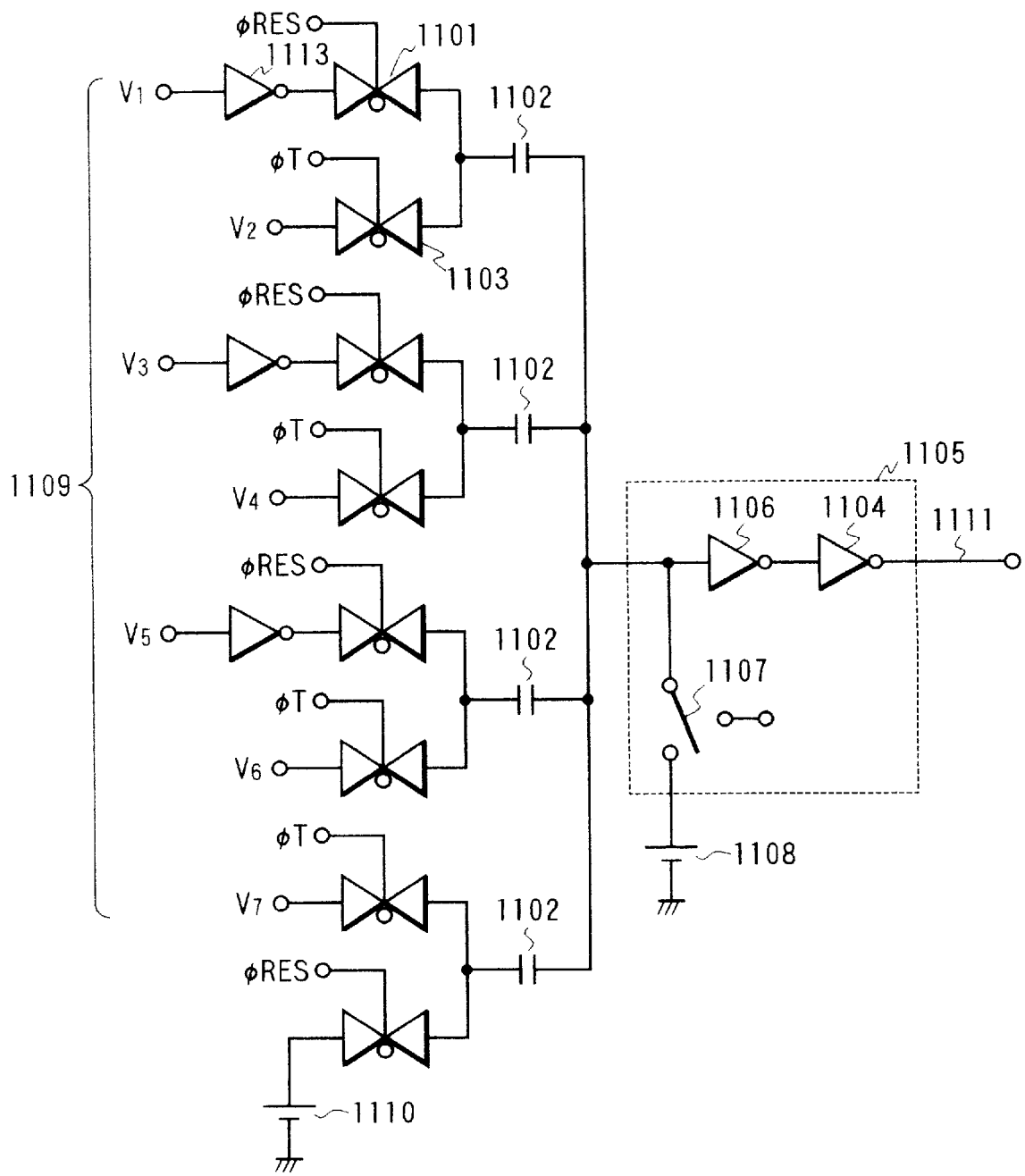

The seventeenth embodiment exemplifies a 3-bit precision analog-to-digital (A/D) converter to which the parallel signal processing circuit of the present invention is applied. FIG. 22 is a schematic block diagram showing an example of the arrangement of the A/D converter. Table 3 below summarizes the outputs with respect to the analog input signal voltages.

TABLE 3

| Analog Input Signal Voltage | S3 | S2 | S1 |
|---|---|---|---|
| $0.0 \leq VA < 0.625$ | 0 | 0 | 0 |
| $0.625 \leq VA < 1.25$ | 0 | 0 | 1 |
| $1.25 \leq VA < 1.875$ | 0 | 1 | 0 |
| $1.875 \leq VA < 2.5$ | 0 | 1 | 1 |
| $2.5 \leq VA < 3.125$ | 1 | 0 | 0 |
| $3.125 \leq VA < 3.75$ | 1 | 0 | 1 |
| $3.75 \leq VA < 4.375$ | 1 | 1 | 0 |
| $4.375 \leq VA < 5.0$ | 1 | 1 | 1 |

The 3-bit precision A/D converter comprises 1-, 2-, and 3-input majority arithmetic operation circuit blocks 1901A, 1901B, and 1901C, and inverters 1902. Input terminals 1903, 1904, and 1905 receive the output signals from the previous majority arithmetic operation circuit blocks. Capacitors 1906, 1907, and 1908 are connected to the input terminals 1903, 1904, and 1905 and respectively have capacitance values C/2, C/2, and C/4 (C is the capacitance connected to a normal input terminal).

An analog input terminal 1909 and set input terminals 1910 are respectively connected with capacitors 1911 and 1912 having capacitance values C/4 and C/8. The respective blocks have digital output terminals S1, S2, and S3.

In this embodiment, a case will be exemplified wherein a 5-V system power supply is used. Referring to FIG. 22, the sense amplifier input of the majority arithmetic operation circuit block 1901A is reset to 0 V, and those of the majority arithmetic operation circuit blocks 1901B and 1901C are reset to about 2.5 V. The capacitors 1102 of the signal input terminals 1903, 1904, and 1905, and the set input terminals 1910 are reset by 5 V. At this time, the signal input terminal 1909 is at 0 V.

Subsequently, assume that the set input terminals 1910 are set at 0 V and the input voltage to the input terminal is changed from 0 V to an analog signal voltage. In this case, in the arithmetic operation circuit block 1901A, when the analog input voltage becomes about 2.5 V or higher, the sense amplifier input voltage in the block 1901A exceeds a logic threshold value voltage (assumed to be 2.5 V in this case), and a H-level signal is output. Table 3 above summarizes the outputs from the sense amplifiers in the majority arithmetic operation circuit blocks. Column S3 of Table 3 shows the output results.

When the analog input signal is 2.5 V or higher, the input terminal 1903 changes from 5 V as the reset potential to 0 V. At this time, the voltage change at the input terminal of the sense amplifier in the majority arithmetic operation circuit block is given by the following formula (16):

$$\{C \times VA - (C/2) \times 5 - (C/4) \times 5\}/(C + C/2 + C/4) \qquad (16)$$

where VA is the analog input voltage.

As can be seen from this equation, the arithmetic operation circuit block 1901B outputs a H-level signal when the analog signal voltage VA is equal to or higher than 3.75 V, and outputs a L-level signal when the voltage VA is equal to or higher than 2.5 V and lower than 3.75 V. Column S2 in Table 3 shows the output results. Similarly, the output from the arithmetic operation circuit block 1901C is as shown in column S1 in Table 3.

As can be understood from the above-mentioned results, an analog input signal can be converted into 3-bit digital value in correspondence with its voltage.

This embodiment has exemplified a 3-bit A/D converter. However, the present invention is not limited to this, and the number of bits of an A/D converter can be easily increased.

In this embodiment, a flash type A/D converter using capacitors has been exemplified. However, the present invention is not limited to this. For example, the present invention may be applied to an encoder circuit of an A/D converter which performs A/D conversion in such a manner that comparators compare signals input to a resistor array and a reference signal, and an encoder encodes the comparison results, thus obtaining the same effects as described above.

Also, the correlation arithmetic operation circuit and the A/D converter have been exemplified. However, the present invention is not limited to these units. For example, the present invention may be applied to various other logic circuits such as a digital-to-analog (D/A) converter, an adder, a subtracter, and the like, thus obtaining the same effects as described above.

Especially, when the present invention is applied to a D/A converter, if C represents the capacitance of the input terminal for receiving LSB data, the capacitances need only be set to be twice as large as the immediately preceding value toward the most significant bit like 2C, 4C, 8C, . . . , thus realizing a binary D/A converter. In this case, the outputs from the commonly connected terminal of the capacitors can be received by a MOS type source-follower amplifier.

(Eighteenth Embodiment)

The parallel arithmetic operation processing circuit of the thirteenth embodiment can be applied to a motion detection circuit as in the tenth embodiment, as shown in FIG. 12.

The motion detection circuit shown in FIG. 12 comprises a control unit 3004, an adder 3005, a register 3006, an address storage unit 3007, and an output buffer 3008 which also serves as the output result storage unit, which are constituted by CMOS circuits. Especially, when the adder 3005 is constituted by the parallel signal processing circuit described in the thirteenth embodiment, parallel additions can be realized, and high-speed processing can be realized in this case.

As described above, according to the motion detection circuit of this embodiment, not only high-speed processing and low cost are realized but also the consumption current can be reduced since arithmetic operations are executed on the basis of capacitances via the latch circuits, thus realizing low consumption power. For this reason, the present invention is suitably applied to a portable equipment such as an 8-mm VTR camera or the like.

(Ninteenth Embodiment)

The parallel arithmetic operation processing circuit of the thirteenth embodiment can also be applied to a high-speed image processing circuit as in the eleventh embodiment, as shown in FIG. 13A.

In this case as well, when the parallel arithmetic operation processing circuit of the present invention is applied to the correlation calculation units 4004 and 4008, high-speed image processing can be realized.

In this manner, each of the correlation calculation units 4004 and 4008 has a smaller number of elements than the conventional circuit, and, in particular, can be arranged at the sensor image pitch.

The high-speed image processing circuit with the above arrangement performs arithmetic operations based on analog signals obtained by the sensor. However, as in the 11th embodiment, when A/D conversion circuits are inserted between the line memories and the bus lines, digital correlation arithmetic operations can be realized. The sensor of the present invention comprises a bipolar transistor. However, the present invention is also effective for a MOS transistor or only a photodiode without arranging any amplification transistor.

Furthermore, a correlation arithmetic operation between data sequences at different times is performed. Alternatively, when the X- and Y-projection results of a plurality of pattern data to be recognized are stored in one memory, pattern recognition can also be realized.

As described above, according to the high-speed image processing circuit, since data which are parallelly and simultaneously read out from the sensor are subjected to parallel processing in the pixel input unit unlike in the conventional processing for serially reading out data from the sensor, high-speed motion detection and pattern recognition processing can be realized.

Since a 1-chip sensor can realize image processing without increasing the size of peripheral circuits, the following high-grade function products can be realized with low cost: control for turning the TV screen toward the user direction, control for turning the wind direction of an air conditioner toward the user direction, tracing control for an 8-mm VTR camera, label recognition in a factory, a reception robot that can automatically recognize a person, an inter-vehicle distance controller for a vehicle, and the like.

Note that the present invention is effective not only for image data but also for audio recognition processing.

(Twentieth Embodiment)

The parallel signal processing circuit described in the 13th embodiment can also be applied to a reception circuit of spread spectrum (SS) communications as in the twelfth embodiment.

As described above, the SS communication has high privacy and is strong against noise since it converts a signal into a multi-bit code and transmits the converted code. However, since the information amount to be transmitted increases, the load of signal processing becomes heavy. When the correlation arithmetic operation circuit block is used as in the thirteenth embodiment, similar processing can be realized at higher speed with a simpler circuit arrangement as in the twelfth embodiment. Hence, the present invention can be applied to radio communications of portable information equipments using the SS communication technique.

(Twenty-first Embodiment)

In the arrangement in which a plurality of input terminals are connected to one capacitor as in the 13th embodiment, an amplifier may be connected between the capacitor and the sense amplifier. With this arrangement, a higher-precision arithmetic operation having a high noise resistance can be attained by a smaller circuit scale as in the first embodiment.

Note that the circuit of the present invention can be normally formed in a semiconductor device, and a plurality of circuits may be built in the device as needed.

The present invention is not limited to the above-mentioned embodiments, and various modifications and combinations may be made within the spirit and scope of the invention.

As described above, according to the present invention, the circuit scale of the parallel signal processing circuit can be reduced, and the arithmetic operation speed can be improved, thus attaining a reduction of the consumption power.

Also, when a semiconductor device is constituted in such a manner that multiple input terminals are connected with capacitance means, terminals, on one side, of the capacitance means are commonly connected, and the commonly connected terminal is input to a sense amplifier via an analog amplifier means, switching noise of the reset switches can be reduced and the circuit arrangement upon connecting a plurality of arithmetic operation circuit blocks in series and/or parallel with each other can be simplified upon constituting a circuit and system that performs parallel arithmetic operation processing, while maintaining a small circuit scale, high arithmetic operation speed, high arithmetic operation precision, and low consumption power.

In addition, when a plurality of signals input from parallelly connected input terminals are subjected to parallel processing, the input signals are switched by switch means provided to the respective input terminals and are input to the capacitance means connected to at least two input terminals, and an output signal is output from a sense amplifier to which the capacitance means are parallelly connected, thus further reducing the circuit scale, improving the arithmetic operation speed, and reducing the consumption power.

Since a plurality of signal processing circuits according to the present invention are arranged, and the output from one parallel signal processing circuit and/or an inverted output from the parallel signal processing circuit are/is input to the input terminals or terminal of another parallel signal processing circuit, high-grade parallel arithmetic operation processing can be realized.

According to the parallel signal processing circuit of the present invention, since a total of capacitances of the capacitance means roughly corresponds to an odd multiple of a minimum capacitance corresponding to one input terminal, a majority arithmetic operation circuit can be constituted.

When the signal processing circuit of the present invention is applied to a correlation arithmetic operation apparatus, a correlation arithmetic operation apparatus which can reduce the circuit scale, allows high-speed arithmetic operations, and requires small consumption power can be realized.

When the parallel signal processing circuit of the present invention is applied to an analog-to-digital converter, an analog-to-digital converter which has a small circuit scale, high arithmetic operation speed, and small consumption power can be realized.

When the parallel signal processing circuit of the present invention is applied to a digital-to-analog converter, a digital-to-analog converter which has a small circuit scale, high arithmetic operation speed, and small consumption power can be realized.

Furthermore, according to a signal processing system having the parallel signal processing circuit of the present invention, when at least one of the correlation arithmetic operation apparatus, analog-to-digital converter, and digital-to-analog converter is constituted using the circuit of the present invention, the circuit scale of the signal processing system can be reduced, a high arithmetic operation speed can be attained, and the consumption power can be reduced.

When the signal processing system comprises an image signal input means for inputting an image signal, high-speed motion detection processing or pattern recognition processing can be realized by performing parallel processing of data which are parallelly and simultaneously read out.

When the signal processing system comprises a storage means for storing information, high-speed processing can be assured while avoiding an increase in load of signal processing owing to an increase in information amount.

What is claimed is:

1. A parallel signal processing circuit, comprising:
    a plurality of signal transfer switching means, each signal transfer switching means having an input terminal for inputting a signal and an output terminal for outputting the signal upon application of a transfer pulse to said signal transfer switching means;
    a plurality of capacitors corresponding to said plurality of signal transfer switching means, each capacitor having a first terminal and a second terminal, the first terminals of said capacitors being respectively connected to the output terminals of said signal transfer switching means;
    a sense amplifier having a first inverter and a second switching means, the second terminals of said capacitors being commonly connected to said first inverter and said second switching means; and
    a reset voltage source connected to said second switching means for supplying a reset voltage to an input side of said first inverter, the supplied reset voltage being in a vicinity of a logical inversion threshold, the logical inversion threshold being a voltage at which an output from the first inverter will be inverted, wherein the reset voltage is supplied before the transfer pulse is applied to said signal transfer switching means.

2. A circuit according to claim 1, wherein a total capacitance of said plurality of capacitors substantially corresponds to an odd multiple of a minimum capacitance corresponding to one of the capacitors.

3. A circuit according to claim 1, further comprising an analog amplifier having an input and an output, wherein said analog amplifier input is connected to the second terminals of the plurality of capacitors and said analog amplifier output is connected to said sense amplifier.

4. A parallel signal processing circuit according to claim 1, wherein the number of input terminals for the plurality of signal transfer switching means is an odd number.

5. A parallel signal processing circuit according to claim 1, wherein at least one of said capacitors has a capacitance different from the capacitance of said other capacitors.

6. A parallel signal processing circuit having a plurality of circuit units each of which comprises a parallel signal processing circuit of claim 1, and an output from one circuit unit is connected to an input terminal of another circuit unit.

7. A semiconductor device having a parallel signal processing circuit of claim 1.

8. A signal processing system having a parallel signal processing circuit of claim 1.

9. A system according to claim 8, wherein said signal processing system comprises a correlation arithmetic operation apparatus.

10. A system according to claim 8, wherein said signal processing system comprises an image processing apparatus.

11. A system according to claim 8, wherein said signal processing system comprises an analog-to-digital converter.

12. A system according to claim 8, wherein said signal processing system comprises a digital-to-analog converter.

13. A system according to claim 8, wherein said signal processing system comprises storage means.

14. A parallel signal processing circuit, comprising:
    a plurality of switching means, each switching means having an input terminal and an output terminal;
    a plurality of capacitors, each capacitor having a first terminal and a second terminal, the first terminals of said capacitors being respectively connected to the output terminals of said switching means; and
    a plurality of sense amplifiers to which said capacitance means are parallelly connected.

15. A parallel signal processing circuit, comprising:
    a plurality of switching means, each switching means having an input terminal and an output terminal;
    a plurality of capacitors, each capacitor having a first terminal and a second terminal, the first terminals of said capacitors being respectively connected to the output terminals of said switching means; and
    to which said capacitance means are parallelly connected,
    a sense amplifier having a first inverter and a second switching means, the second terminals of said capacitors being commonly connected to said first inverter and said second switching means,
    wherein the input terminal of said switching means has a line connected to said capacitor first terminal via a second inverter and a line connected to said capacitor first terminal without going through any inverter.

16. A parallel signal processing circuit, comprising:
    a plurality of switching means, each switching means having an input terminal and an output terminal, the total number of input terminals for the plurality of switching means being an odd number;
    a plurality of capacitors, each capacitor having a first terminal and a second terminal, the first terminals of said capacitors being respectively connected to the output terminals of said switching means; and
    to which said capacitance means are parallelly connected,
    a sense amplifier having a first inverter and a second switching means, the second terminals of said capacitors being commonly connected to said first inverter and said second switching means,
    wherein at least one of the input terminals is connected to both a line connected to said capacitor first terminal via a second inverter and a line connected to said capacitor first terminal without going through any inverter.

17. A circuit according to claim 16, wherein a capacitance of said capacitor connected to at least one input terminal has a capacitance different from a capacitance of said other capacitors.

18. A circuit according to claim 16, wherein one of said capacitors has a capacitance different from another of said capacitors.

19. A parallel signal processing circuit, comprising:
a plurality of signal transfer switching means, each signal transfer switching means having an input terminal for inputting a signal and an output terminal for outputting the signal upon application of a transfer pulse to said signal transfer switching means;
a plurality of first capacitors corresponding to said plurality of signal transfer switching means, each first capacitor having a first terminal and a second terminal, the first terminals of said first capacitors being respectively connected to the output terminals of said signal transfer switching means;
a sense amplifier having a first inverter and a second switching means;
an analog amplifier having an input and an output, said analog amplifier input being connected to the second terminals of the plurality of first capacitors and said analog amplifier output being connected to said sense amplifier; and
a reset voltage source connected to said second switching means for supplying a reset voltage to an input side of the first inverter of said sense amplifier, wherein the reset voltage is supplied before the transfer pulse is applied to said signal transfer switching means.

20. A parallel signal processing circuit according to claim 19, wherein when C represents a minimum capacitance of said first capacitors, a total capacitance of the plurality of first capacitors substantially corresponds to an odd multiple of the minimum capacitance C.

21. A parallel signal processing circuit according to claim 19, wherein the number of input terminals for the plurality of signal transfer switching means is an odd number.

22. A parallel signal processing circuit according to claim 19, wherein at least one of said first capacitors has a capacitance different from the capacitance of said other first capacitors.

23. A parallel signal processing circuit having a plurality of circuit units each of which comprises a parallel signal processing circuit of claim 19, and an output from one circuit unit is connected to an input terminal of another circuit unit.

24. A semiconductor device having a parallel signal processing circuit of claim 19.

25. A circuit according to claim 19, wherein said analog amplifier means comprises voltage amplifier means.

26. A signal processing system having a parallel signal processing circuit of claim 19.

27. A system according to claim 26, wherein said signal processing system comprises a correlation arithmetic operation apparatus.

28. A system according to claim 26, wherein said signal processing system comprises an image processing apparatus.

29. A system according to claim 26, wherein said signal processing system comprises an analog-to-digital converter.

30. A system according to claim 26, wherein said signal processing system comprises a digital-to-analog converter.

31. A system according to claim 26, wherein said signal processing system comprises storage means.

32. A parallel signal processing circuit, comprising:
a plurality of switching means, each switching means having an input terminal and an output terminal;
a plurality of capacitors, each capacitor having a first terminal and a second terminal, the first terminals of said capacitors being respectively connected to the output terminals of said switching means;
a plurality of sense amplifiers having a first inverter and a second switching means, the second terminals of said capacitors being commonly connected to said first inverter and said second switching means; and
an analog amplifier having an input and an output, said analog amplifier input being connected to the second terminals of the plurality of capacitors and said analog amplifier output being connected to said sense amplifier.

33. A parallel signal processing circuit, comprising:
a plurality of switching means, each switching means having an input terminal and an output terminal;
a plurality of capacitors, each capacitor having a first terminal and a second terminal, the first terminals of said capacitors being respectively connected to the output terminals of said switching means;
a sense amplifier having a first inverter and a second switching means, the second terminals of said capacitors being commonly connected to said first inverter and said second switching means; and
an analog amplifier having an input and an output, said analog amplifier input being connected to the second terminals of the plurality of capacitors and said analog amplifier output being connected to said sense amplifier,
wherein the input terminal of said switching means has a line connected to said capacitor first terminal via a second inverter and a line connected to said capacitor first terminal without going through any inverter.

34. A parallel signal processing circuit according to claim 33, wherein to the number of input terminals for the plurality of switching means is an odd number.

35. A parallel signal processing circuit according to claim 34, wherein a capacitance of said capacitor connected to at least one input terminal has a capacitance different from a capacitances of said other capacitors.

36. A parallel signal processing circuit, comprising:
a plurality of switching means, each switching means having an input terminal and an output terminal;
a plurality of first capacitors, each capacitor having a first terminal and a second terminal, the first terminals of said first capacitors being respectively connected to the output terminals of said switching means;
a sense amplifier having a first inverter and a second switching means, the second terminals of said first capacitors being commonly connected to said first inverter and said second switching means;
an analog amplifier having an input and an output, said analog amplifier input being connected to the second terminals of the plurality of capacitors and said analog amplifier output being connected to said sense amplifier; and
a second capacitor is arranged between said analog amplifier and said sense amplifier.

37. A parallel signal processing circuit according to claim 36, further comprising a plurality of said second capacitors, and a plurality of said sense amplifiers respectively connected to said second capacitance means.

38. A parallel signal processing circuit according to claim 37, wherein an output of one of said sense amplifiers is connected to an input of another sense amplifier via a third capacitor.

39. A circuit according to claim 36, further comprising a plurality of said second capacitance means, and a plurality of said sense amplifiers wherein at least one of said plurality of sense amplifiers is connected to the commonly connected outputs of the first capacitance means, the other sense amplifiers are connected to a respective output of said second capacitance means.

40. A parallel signal processing circuit according to claim 39, further comprising a control input terminal for inputting a signal via a fourth capacitor, connected at an input stage of said sense amplifier connected via said analog amplifier.

41. A parallel signal processing circuit wherein a first circuit has M multiple input terminals to which capacitance means are connected, terminals, on one side, of said capacitance means are commonly connected, the commonly connected terminal is connected to a first input terminal of a second circuit via analog amplifier means, the commonly connected terminal is connected to a second input terminal of said second circuit via a sense amplifier, capacitance means of said second input terminal has a capacitance corresponding to an integer (obtained by rounding up (M/2)) multiple of a capacitance of said capacitance means of said first circuit, and said first input terminal has a capacitance M times the capacitance of said capacitance means of said first circuit.

42. A circuit according to claim 41, wherein an output from said analog amplifier means is connected to a third input terminal of a third circuit, said capacitance means of said second input terminal is connected to a fourth input terminal of said third circuit via a sense amplifier, a signal which is the same as a signal input to said second input terminal is connected to a fifth input terminal of said third circuit, capacitance means of said third input terminal has a capacitance M times the capacitance of said capacitance means of said first circuit, capacitance means of said fourth input terminal has a capacitance ($\frac{1}{2}$) times the capacitance of said capacitance means of said second input terminal, and capacitance means of said fifth input terminal has a capacitance equal to the capacitance of said capacitance means of said second input terminal.

43. A parallel signal processing circuit comprising:
- a plurality of first switching means, each first switching means having an input terminal and an output terminal;
- a plurality of capacitors, each capacitor having a first terminal and a second terminal, the first terminals of said capacitors being respectively connected to the output terminals of said first switching means, and the second terminals being commonly connected;
- a plurality of sense amplifiers, each of which have a first inverter and a second switching means;
- an analog amplifier electrically connected to the commonly connected second terminals of said capacitors, wherein at least one of said sense amplifiers is connected to the output of said analog amplifier; and
- a voltage source connected to said second switching means for supplying a voltage to said first inverter, the voltage being in a vicinity of a logical threshold, the logical threshold being a voltage at which an output from the first inverter will be inverted.

44. A parallel signal processing circuit comprising:
- a plurality of first switching means, each first switching means having an input terminal and an output terminal;
- a plurality of capacitors, each capacitor having a first terminal and a second terminal, the first terminals of said capacitors being respectively connected to the output terminals of said first switching means;
- a sense amplifier having a first inverter and a second switching means, the second terminals of said capacitors being commonly connected to said first inverter and said second switching means;
- a voltage source connected to said second switching means for supplying a voltage to said first inverter, the voltage being in a vicinity of a logical threshold, the logical threshold being a voltage at which an output from the first inverter will be inverted; and
- a plurality of second inverters and a plurality of corresponding third switching means, an output of each second inverter being connected to an input terminal of its corresponding third switching means, wherein the first terminal of each said capacitor is additionally connected to a respective output terminal of said third switching means.

45. A parallel signal processing circuit comprising:
- a plurality of first switching means, each first switching means having an input terminal and an output terminal;
- a plurality of capacitors, each capacitor having a first terminal and a second terminal, the first terminals of said capacitors being respectively connected to the output terminals of said first switching means;
- a sense amplifier having a first inverter and a second switching means, the second terminals of said capacitors being commonly connected to said first inverter and said second switching means;
- a voltage source connected to said second switching means for supplying a voltage to said first inverter, the voltage being in a vicinity of a logical threshold, the logical threshold being a voltage at which an output from the first inverter will be inverted;
- a plurality of second inverters and a plurality of corresponding third switching means, an output of each second inverter being connected to an input terminal of its corresponding third switching means, wherein the first terminal of each said capacitor is additionally connected to a respective output terminal of said third switching means, wherein the number of input terminals for the plurality of first switching means is an odd number.

46. A parallel signal processing circuit comprising:
- a plurality of first switching means, each first switching means having an input terminal and an output terminal;
- a plurality of first capacitors, each capacitor having a first terminal and a second terminal, the first terminals of said first capacitors being respectively connected to the output terminals of said first switching means and the second terminals being commonly connected;
- a plurality of sense amplifiers, each said sense amplifier having a first inverter and a second switching means;
- an analog amplifier having an input and an output, said analog amplifier input being electrically connected to the commonly connected second terminals of said first capacitors and said analog amplifier output being connected to said sense amplifiers; and
- a voltage source connected to said second switching means for supplying a voltage to said sense amplifier.

47. A parallel signal processing circuit comprising:
- a plurality of first switching means, each first switching means having an input terminal and an output terminal;
- a plurality of first capacitors, each capacitor having a first terminal and a second terminal, the first terminals of said first capacitors being respectively connected to the output terminals of said first switching means;
- a sense amplifier having a first inverter and a second switching means, the second terminals of said first capacitors being commonly connected to said first inverter and said second switching means;

an analog amplifier having an input and an output, said analog amplifier input being connected to the second terminals of the plurality of first capacitors and said analog amplifier output being connected to said sense amplifier;

a voltage source connected to said second switching means for supplying a voltage to said sense amplifier; and a plurality of second inverters and a plurality of corresponding third switching means, an output of each second inverter being connected to an input terminal of its corresponding third switching means, wherein the first terminal of each said first capacitor is additionally connected to a respective output terminal of said third switching means.

48. A parallel signal processing circuit comprising:

a plurality of first switching means, each first switching means having an input terminal and an output terminal;

a plurality of first capacitors, each capacitor having a first terminal and a second terminal, the first terminals of said first capacitors being respectively connected to the output terminals of said first switching means;

a sense amplifier having a first inverter and a second switching means, the second terminals of said first capacitors being commonly connected to said first inverter and said second switching means;

an analog amplifier having an input and an output, said analog amplifier input being connected to the second terminals of the plurality of first capacitors and said analog amplifier output being connected to said sense amplifier;

a voltage source connected to said second switching means for supplying a voltage to said sense amplifier; and a second capacitor having an input and an output terminal, wherein said second capacitor input terminal is connected to said analog amplifier output and said second capacitor output terminal is connected to said sense amplifier.

49. A parallel signal processing circuit according to claim 48, further comprising a plurality of said second capacitors, and a plurality of said sense amplifiers respectively connected to said second capacitors, wherein said plurality of sense amplifiers are connected to the outputs of said second capacitors.

50. A parallel signal processing circuit according to claim 48, further comprising a plurality of said second capacitors, and a plurality of said sense amplifiers, wherein at least one of said plurality of sense amplifiers is connected to the commonly connected second terminals of the first capacitors, the other sense amplifiers are connected to the respective output of said second capacitors.

51. A parallel signal processing circuit comprising.

a plurality of first switching means, each first switching means having an input terminal and an output terminal;

a plurality of first capacitors each capacitor having a first terminal and a second terminal, the first terminals of said first capacitors being respectively connected to the output terminals of said first switching means;

a sense amplifier having a first inverter and a second switching means, the second terminals of said first capacitors being commonly connected to said first inverter and said second switching means;

an analog amplifier having an input and an output, said analog amplifier input being connected to the second terminals of the plurality of first capacitors and said analog amplifier output being connected to said sense amplifier;

a voltage source connected to said second switching means for supplying a voltage to said sense amplifier; and a plurality of second inverters and a plurality of corresponding third switching means, an output of each second inverter being connected to an input terminal of its corresponding third switching means, wherein the first terminal of each said first capacitor is additionally connected to a respective output terminal of said third switching means, wherein the number of input terminals for the plurality of first switching means is an odd number.

52. A parallel signal processing circuit according to claim 51, wherein one of said first capacitors has a capacitance different from another of said first capacitors.

* * * * *

UNITED STATES PATENT AND TRADEMARK OFFICE
CERTIFICATE OF CORRECTION

PATENT NO.   : 5,951,632
DATED        : September 14, 1999
INVENTOR(S)  : TETSUNOBU KOCHI It is certified that error appears in the above-identified patent and that said Letters Patent is hereby corrected as shown below:

ON THE TITLE PAGE [56] References Cited:

FOREIGN PATENT DOCUMENTS, 2 536 922 11/1982 France ." should be deleted; and
    Attorney, Agent, or Firm, "Fitzpatrick Cella Harper & Scinto" should read --Fitzpatrick, Cella, Harper & Scinto--.

COLUMN 2:

Line 18, "capacitances" should read --capacitors.

COLUMN 8:

Line 24, "likes" should read --like--; and
    Line 48, "have" should read --having--.

COLUMN 26:

Line 34, "to" should be deleted; and
    Line 38, "capacitances" should read --capacitance--.

COLUMN 27:

Line 1, "amplifiers" should read --amplifiers,--;
    Line 10, "circuit" should read --circuit,--; and
    Line 47, "have" should read --having--.

COLUMN 28:

Line 31, "inverted;" should read --inverted; and--.

UNITED STATES PATENT AND TRADEMARK OFFICE
CERTIFICATE OF CORRECTION

PATENT NO.    : 5,951,632
DATED         : September 14, 1999
INVENTOR(S)   : TETSUNOBU KOCHI It is certified that error appears in the above-identified patent and that said Letters Patent is hereby corrected as shown below:

COLUMN 30:

Line 12, "comprising." should read --comprising:--.

Signed and Sealed this

Twenty-second Day of August, 2000

Attest:

Q. TODD DICKINSON

Attesting Officer    Director of Patents and Trademarks